United States Patent
Inoue et al.

(10) Patent No.: US 9,647,665 B2
(45) Date of Patent: May 9, 2017

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Hiroki Inoue, Kanagawa (JP);
Takanori Matsuzaki, Kanagawa (JP);
Shuhei Nagatsuka, Kanagawa (JP);
Takahiko Ishizu, Kanagawa (JP);
Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/967,553

(22) Filed: Dec. 14, 2015

(65) Prior Publication Data
US 2016/0173096 A1    Jun. 16, 2016

(30) Foreign Application Priority Data
Dec. 16, 2014    (JP) .................................. 2014-254394

(51) Int. Cl.
*H03L 5/00*     (2006.01)
*H03K 19/0185*  (2006.01)
*H03K 19/00*    (2006.01)

(52) U.S. Cl.
CPC . *H03K 19/018521* (2013.01); *H03K 19/0016* (2013.01)

(58) Field of Classification Search
CPC ........................ H03K 3/012; H03K 19/018507
(Continued)

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Dinh T Le
(74) *Attorney, Agent, or Firm* — Fish & Richardson P.C.

(57) ABSTRACT

To provide a semiconductor device that inhibits unexpected output of a high-level signal immediately after the rise of a power supply voltage. A semiconductor device includes a first buffer circuit, a level shifter circuit, and a second buffer circuit. A first potential is supplied to the first buffer circuit, and a second potential is supplied to the level shifter circuit and the second buffer circuit; consequently, the semiconductor device returns to a normal state. The first potential is supplied to the first buffer circuit before the second potential is supplied to the level shifter circuit and the second buffer circuit, whereby the operations of the level shifter circuit and the second buffer circuit can be controlled. This inhibits unexpected output of a high-level signal to a wiring connected to the second buffer circuit.

12 Claims, 28 Drawing Sheets

(58) Field of Classification Search
USPC .......... 326/61–62, 80–81; 327/306, 333
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,714,047 | B2* | 3/2004 | Shimizu ......... H03K 19/018585 326/62 |
| 6,727,522 | B1 | 4/2004 | Kawasaki et al. |
| 6,943,533 | B2 | 9/2005 | Okuno |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,790,719 | B2* | 9/2010 | Vos ......... C07C 279/22 514/235.8 |
| 8,400,817 | B2 | 3/2013 | Yamazaki et al. |
| 8,450,783 | B2 | 5/2013 | Yamazaki et al. |
| 8,508,967 | B2 | 8/2013 | Yamazaki et al. |
| 9,053,969 | B2 | 6/2015 | Yamazaki et al. |
| 9,105,353 | B2 | 8/2015 | Nishijima |
| 9,153,589 | B2 | 10/2015 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0204077 | A1* | 8/2008 | Huang ............. H03K 19/00315 326/80 |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2012/0154014 | A1* | 6/2012 | Nakashima ...... H03K 3/356182 327/333 |
| 2016/0027784 | A1 | 1/2016 | Yamazaki et al. |
| 2016/0173097 | A1 | 6/2016 | Inoue et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-039059 A | 2/2012 |
| JP | 2012-256820 A | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

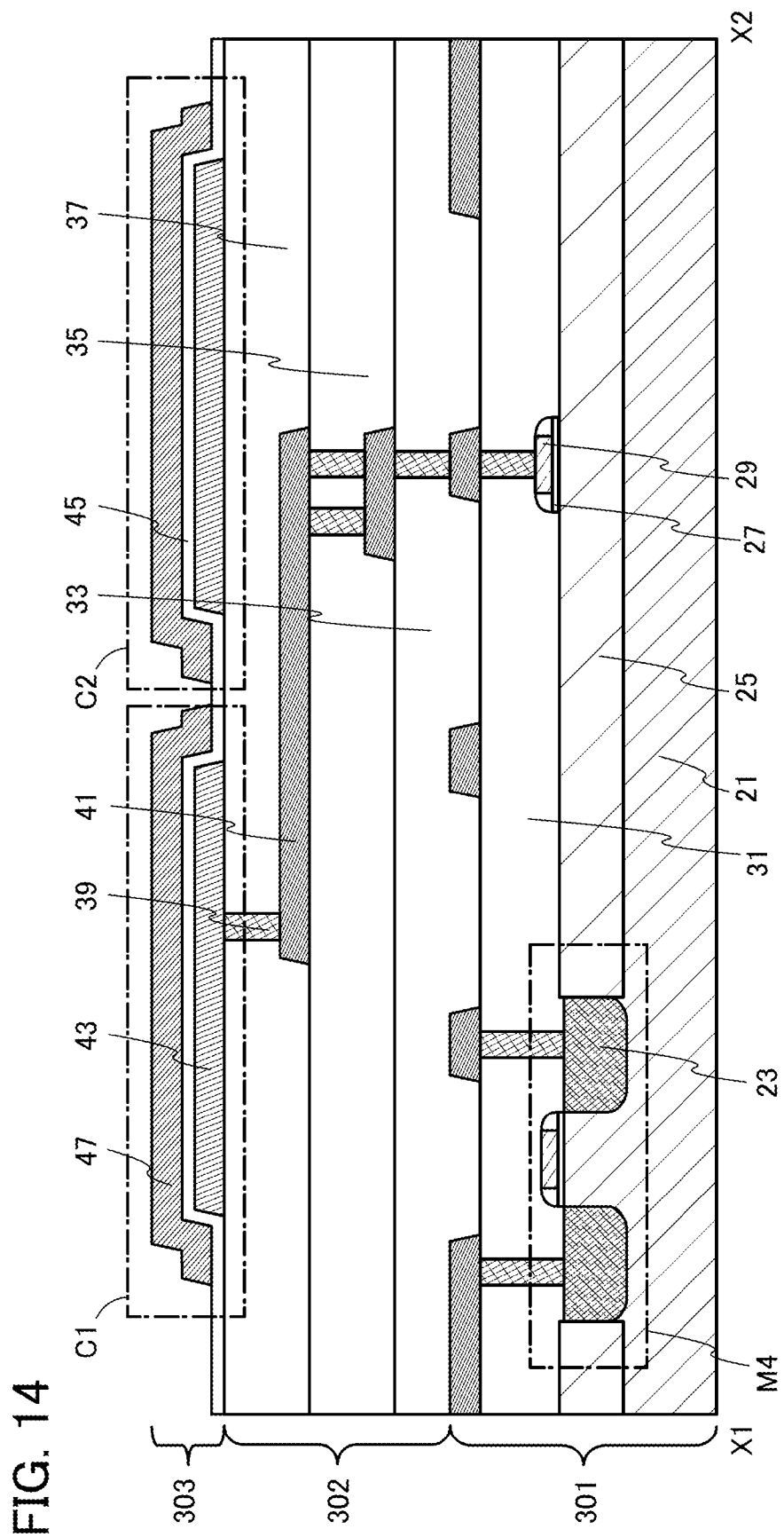

SEMICONDUCTOR DEVICE AND ELECTRONIC DEVICE

BACKGROUND OF THE INVENTION

1. Field of the Invention

Embodiments of the present invention relate to a semiconductor device and an electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

The following semiconductor devices have attracted attention: a semiconductor device that is capable of retaining data using a transistor including an oxide semiconductor (OS) in a semiconductor layer (hereinafter referred to as an OS transistor); and a semiconductor device that is capable of retaining data using an OS transistor and a transistor including silicon (Si) in a semiconductor layer (hereinafter referred to as a Si transistor) in combination (see Patent Documents 1 and 2).

REFERENCE

[Patent Document 1] Japanese Published Patent Application No. 2012-39059
[Patent Document 2] Japanese Published Patent Application No. 2012-256820

SUMMARY OF THE INVENTION

To control on/off of the OS transistor, a signal with a large amplitude is needed. Therefore, a signal whose voltage is raised is output to a gate of the OS transistor. A plurality of power supply voltages are needed for a booster circuit. A semiconductor device is capable of retaining data even without application of a power supply voltage, so that application of a plurality of power supply voltages can be stopped.

In the case where the plurality of power supply voltages are supplied again, however, unintentionally supplying a high-level potential to the gate of the OS transistor might cause loss of the retained data.

An object of one embodiment of the present invention is to provide a novel semiconductor device, a novel electronic device, or the like.

Another object of one embodiment of the present invention is to provide a semiconductor device or the like with a novel structure that can prevent data loss due to malfunction of the semiconductor device. Another object of one embodiment of the present invention is to provide a semiconductor device or the like with a novel structure that can reduce power consumption. Another object of one embodiment of the present invention is to provide a semiconductor device or the like with a novel structure that can inhibit unintentional output of a high-level potential from a booster circuit that raises the voltage of a signal by being supplied with a plurality of power supply voltages.

Note that the object of one embodiment of the present invention is not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the aforementioned objects and the other objects.

One embodiment of the present invention is a semiconductor device including a first buffer circuit, a level shifter circuit, a second buffer circuit, and first to third wirings. The first wiring is configured to supply a first potential. The second wiring is configured to supply a second potential, which is higher than the first potential. The third wiring is configured to supply a third potential, which is lower than the first potential and the second potential. The first buffer circuit is electrically connected to the first wiring and the third wiring. Each of the level shifter circuit and the second buffer circuit is electrically connected to the second wiring and the third wiring. A power supply voltage is applied to the first buffer circuit by switching a potential that is supplied to the first wiring from the third potential to the first potential. A power supply voltage is applied to the level shifter circuit and the second buffer circuit by switching a potential that is supplied to the second wiring from the third potential to the second potential. Switching the potential that is supplied to the first wiring from the third potential to the first potential is prior to switching the potential that is supplied to the second wiring from the third potential to the second potential.

The semiconductor device of one embodiment of the present invention preferably includes a memory cell. The memory cell includes a transistor and is configured to store charge depending on data in a node connected to the transistor that is off. The second buffer circuit is electrically connected to a gate of the second transistor.

In the semiconductor device of one embodiment of the present invention, the transistor preferably includes an oxide semiconductor in a channel formation region.

Note that other embodiments of the present invention will be described in the following embodiments with reference to drawings.

One embodiment of the present invention can provide a novel semiconductor device, a novel electronic device, or the like.

Alternatively, one embodiment of the present invention can provide a semiconductor device or the like with a novel structure that can prevent data loss due to malfunction of the semiconductor device. Alternatively, one embodiment of the present invention can provide a semiconductor device or the like with a novel structure that can reduce power consumption. Alternatively, one embodiment of the present invention can provide a semiconductor device or the like with a novel structure that can inhibit unintentional output of a high-level potential from a booster circuit that raises the voltage of a signal by being supplied with a plurality of power supply voltages.

Note that the effect of one embodiment of the present invention is not limited to the effects listed above. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the aforementioned effects and the other effects. Accordingly, one embodiment of the present invention does not have the aforementioned effects in some cases.

BRIEF DESCRIPTION OF THE DRAWINGS

FIG. 14 is a cross-sectional schematic view illustrating one embodiment of the present invention.

DETAILED DESCRIPTION OF THE INVENTION

Figure 1A:
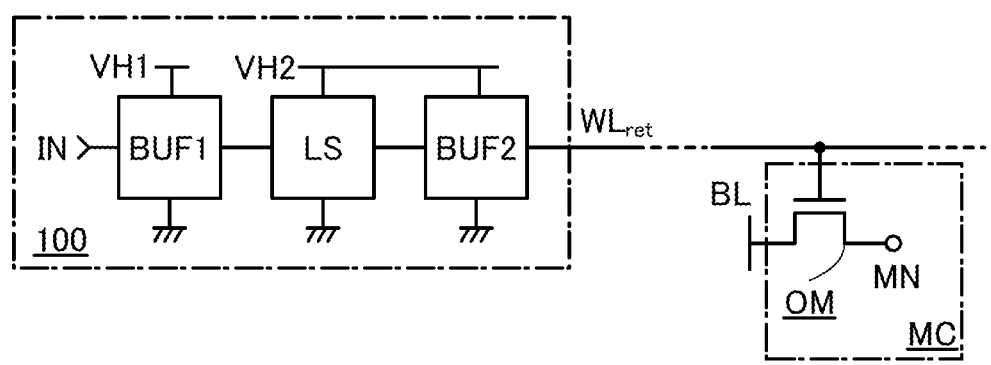
FIGS. 1A and 1B are a block diagram and a timing chart that illustrate one embodiment of the present invention.

Embodiments and an example will be described below with reference to the drawings. However, the embodiments and example can be implemented with various modes. It will be readily appreciated by those skilled in the art that modes and details can be changed in various ways without departing from the spirit and scope of the present invention. Therefore, the present invention should not be interpreted as being limited to the description of the embodiments and example below.

In this specification and the like, ordinal numbers such as first, second, and third are used in order to avoid confusion among components. Thus, the terms do not limit the number or order of components. In this specification and the like, a "first" component in one embodiment can be referred to as a "second" component in other embodiments or claims. Furthermore, in this specification and the like, a "first" component in one embodiment can be referred to without the ordinal number in other embodiments or claims.

In the drawings, the same components, components having similar functions, components formed of the same material, or components formed at the same time are denoted by the same reference numerals in some cases, and description thereof is not repeated in some cases.

Embodiment 1

In this embodiment, a semiconductor device of one embodiment of the disclosed invention will be described. In particular, the structure of a semiconductor device including an output circuit for outputting a signal to a memory cell will be described in this embodiment.

FIG. 1A illustrates an output circuit 100 and a memory cell MC. The memory cell MC includes a transistor OM. The transistor OM is connected to a wiring BL and a node MN. In the output circuit 100, a signal is input to a terminal IN and output to a wiring $WL_{ret}$ connected to a gate of the transistor OM.

Note that the transistor OM has a function as a switch. The transistor OM is preferably a transistor in which a current flowing between the source and drain in the off state (off-state current) is low. A transistor with a low off-state current is preferably a transistor containing an oxide semiconductor in its channel formation region (OS transistor). An OS transistor has the following advantages: the low off-state current thereof; the capability of being formed so as to overlap with a Si transistor; and the like. An OS transistor will be described in detail in an embodiment below.

The memory cell MC controls on/off of the transistor OM to write a voltage depending on data supplied to the wiring BL (data voltage) to a node MN and hold the voltage. In the case where the transistor OM is an n-channel transistor, a high-level potential is supplied to the wiring $WL_{ret}$, which is the gate of the transistor, to turn on the transistor so that a data voltage is written to the node MN. Then, a low-level potential is kept being supplied to the wiring $WL_{ret}$ to turn off the transistor so that the data voltage is held.

The output circuit 100 is a circuit for outputting a signal to the wiring $WL_{ret}$. Setting a low-level potential that is supplied to the wiring $WL_{ret}$ from the output circuit 100 to a ground potential allows the transistor OM to be kept off even when the operation of the output circuit 100 is intentionally terminated. Alternatively, in the case where a power supply voltage cannot be continuously applied as in a wireless device, the transistor OM can be kept off even when the operation of the output circuit 100 is intermittently terminated. Thus, the data voltage held in the memory cell MC is retained even after the application of the power supply voltage to the output circuit 100 is terminated.

Since the output circuit 100 turns on the transistor to write the data voltage, a signal with a large amplitude is needed. The output circuit 100 obtains a signal with a large amplitude by application of different power supply voltages to a plurality of circuits. The output circuit 100 includes a buffer circuit BUF1, a level shifter circuit LS, and a buffer circuit BUF2, for example.

The buffer circuit BUF1 is connected to a wiring VH1 so that the application of a power supply voltage to the buffer circuit BUF1 can be controlled. The level shifter circuit LS and the buffer circuit BUF2 are connected to a wiring VH2 so that the application of a power supply voltage to each of the level shifter circuit LS and the buffer circuit BUF2 can be controlled. When a power supply voltage is applied, a voltage VDD1 is applied to the wiring VH1, and a voltage VDD2 is applied to the wiring VH2. When the application of a power supply voltage is terminated, a ground voltage is applied to both the wirings VH1 and VH2.

In the case where the application and the termination of a power supply voltage are alternately performed, the potential of each node in the output circuit 100 is not stabilized. Particularly a variation in the potential of a node that is influenced by the wiring VH2 whose voltage is stepped up and down instantaneously causes an unexpected potential variation, and a high-level signal is output to the wiring $WL_{ret}$. Thus, the off state of the transistor OM becomes unstable and the data voltage of the memory cell MC is lost in some cases.

In one embodiment of the present invention, in resuming the supply of a power supply voltage, the voltage VDD1 and the voltage VDD2 are applied to the wiring VH1 and the wiring VH2, respectively, at different timings. The operations will be described with reference to a timing chart shown in FIG. 1B.

Figure 1B:
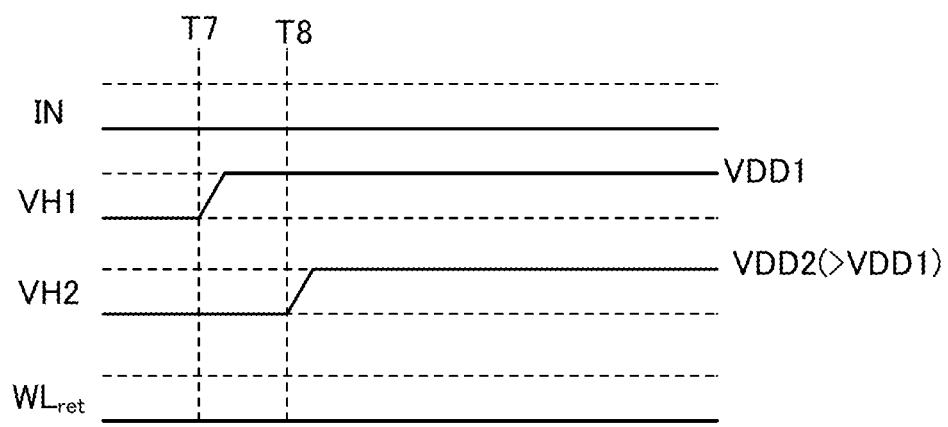

In the timing chart shown in FIG. 1B, a signal of the terminal IN is a low-level signal. In the initial state before a time T7, the voltages of the wirings VH1 and VH2 are low-level voltages.

At the time T7, the voltage VDD1 is applied to the wiring VH1. An increase in the voltage of the wiring VH1 fixes the output of the buffer circuit BUF1.

When the output of the buffer circuit BUF1 is fixed, the operation of the level shifter circuit LS becomes stable. That is, the level shifter circuit LS becomes able to stably output the voltage depending on the signal of the terminal IN. At the time T7, the voltage of the wiring VH2 is set to a ground voltage. Therefore, a signal that is output from the buffer circuit BUF2 to the wiring $WL_{ret}$ can be kept at a low level.

Then, at a time T8, the voltage VDD2 is applied to the wiring VH2. At the stage of the time T7, the output of the buffer circuit BUF1 is supplied to the level shifter circuit LS, and a stable operation can be performed. Here, a low-level potential is supplied to the terminal IN, and the buffer circuit BUF1 is operated so that a low-level potential is output from the level shifter circuit LS. Thus, the output of the level shifter circuit LS is not influenced by an increase in the potential of the wiring VH2. The buffer circuit BUF2 to which the low-level potential output from the level shifter circuit LS is supplied can output a low-level potential to the wiring $WL_{ret}$.

Thus, when the application of a power supply voltage for shifting the level of a signal is resumed, the potential of the wiring $WL_{ret}$ can be kept at a low level. Therefore, data loss can be prevented from being caused by a high-level potential that is unexpectedly output to the wiring $WL_{ret}$.

Figure 2A:
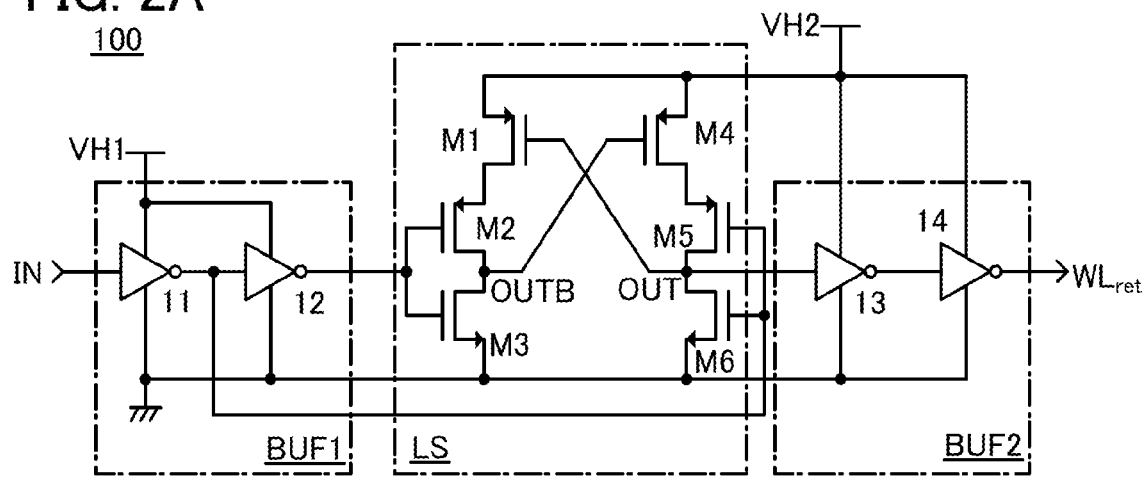
FIGS. 2A and 2B are a circuit diagram and a timing chart that illustrate one embodiment of the present invention.

FIG. 2A is an example of a circuit diagram of the output circuit 100 in FIG. 1A. In FIG. 2A, the buffer circuit BUF1 includes inverter circuits 11 and 12. The level shifter circuit LS includes transistors M1 to M6, and the buffer circuit BUF2 includes inverter circuits 13 and 14. Power supply voltages are applied to the circuits from the wirings VH1 and VH2.

The output circuit 100 illustrated in FIG. 2A has a function of outputting a low-level signal to the wiring $WL_{ret}$ by supplying the low-level signal to the terminal IN. The level shifter circuit LS includes a node OUT and a node OUTB. In the level shifter circuit LS, the potential of the node OUT is set at a low level by a signal output from the buffer circuit BUF1 and then the voltage VDD2 is applied to the wiring VH2, whereby the low-level signal can be stably output to the wiring $WL_{ret}$.

Figure 2B:
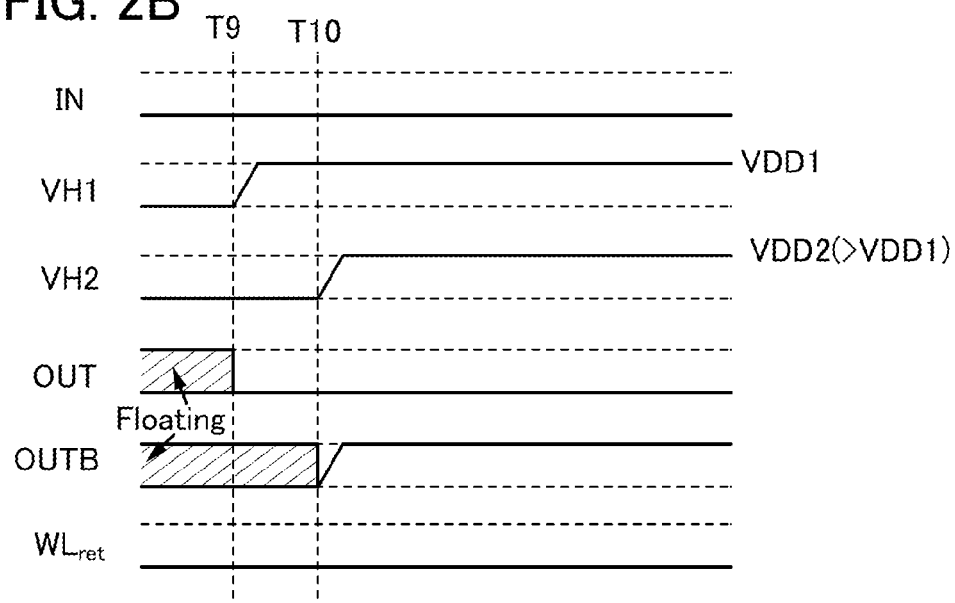

FIG. 2B is a timing chart showing the operations of the output circuit 100 illustrated in FIG. 2A.

In the timing chart shown in FIG. 2B, a signal of the terminal IN is a low-level signal. In the initial state before a time T9, the voltages of the wirings VH1 and VH2 are low-level voltages. At this time, the nodes OUT and OUTB are in an electrically floating state. The wiring $WL_{ret}$ is also in an electrically floating state. Note that the potential of the wiring $WL_{ret}$ finally becomes at a low level because of a leakage current flowing through the buffer circuit BUF2, or the like, and the wiring $WL_{ret}$ is brought into a floating state. Thus, the potential of the wiring $WL_{ret}$ is at a low level in FIG. 2B.

At the time T9, the voltage VDD1 is applied to the wiring VH1. An increase in the voltage of the wiring VH1 fixes the outputs of the inverter circuits 11 and 12. A low-level potential is supplied to gates of the transistors M2 and M3, and a high-level potential is supplied to gates of the transistors M5 and M6. Thus, the transistors M2 and M6 are turned on, and the transistors M3 and M5 are turned off. Accordingly, the potential of the node OUT becomes at a low level (ground voltage).

Then, the voltage VDD2 is applied to the wiring VH2 at a time T10. At the stage of the time T9, the potential of the node OUT is at a low level, and an increase in the potential of the wiring VH2 turns on the transistor M1. Accordingly, the potential of the node OUTB becomes at a high level, and the transistor M4 is turned off.

The voltage VDD1 is applied to the wiring VH1 before the voltage VDD2 is applied to the wiring VH2, whereby the voltage of the node OUT can be fixed before the voltage VDD2 is applied to the wiring VH2. Thus, the output of the level shifter circuit LS is not influenced by an increase in the potential of the wiring VH2. The buffer circuit BUF2 to which a low-level potential output from the level shifter circuit LS is supplied can output the low-level potential to the wiring $WL_{ret}$.

Thus, when the application of a power supply voltage for shifting the level of a signal is resumed, the potential of the wiring $WL_{ret}$ can be kept at a low level. Therefore, data loss can be prevented from being caused by a high-level potential that is unexpectedly output to the wiring $WL_{ret}$.

Figure 3:
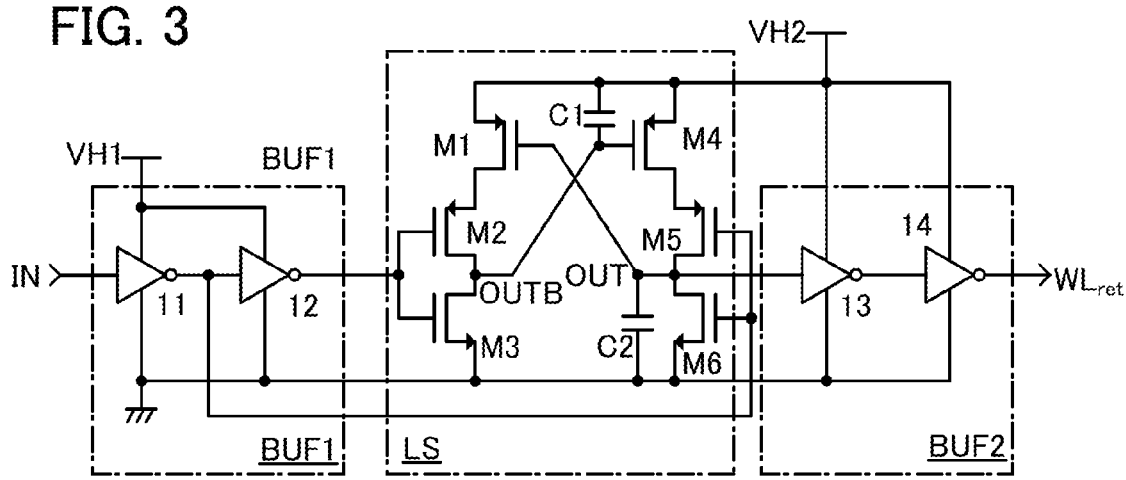
FIG. 3 is a circuit diagram illustrating one embodiment of the present invention.

Note that the circuit diagram in FIG. 2A illustrates a configuration without a capacitor for holding the voltages of the nodes OUT and OUTB; however, a capacitor may be provided. FIG. 3 is a circuit diagram different from FIG. 2A in that capacitors C1 and C2 are provided. One of electrodes of the capacitor C1 is electrically connected to the node OUTB, and the other of the electrodes of the capacitor C1 is electrically connected to the wiring VH2. One of electrodes of the capacitor C2 is electrically connected to the node OUT, and the other of the electrodes of the capacitor C2 is electrically connected to a wiring to which a ground voltage is applied.

With the configuration illustrated in the circuit diagram in FIG. 3, the voltage of the node OUTB in an electrically floating state can be raised immediately after the time T10 in FIG. 2B with an increase in the voltage of the wiring VH2 due to capacitive coupling caused by the capacitor C1.

Note that the transistors M1 to M6 are preferably transistors including silicon in channel formation regions (Si transistors). Adding impurities and the like can reduce variations in threshold voltage caused when the Si transistors are fabricated through the same process. Furthermore, the capacitors C1 and C2 are preferably provided so as to overlap with the transistors M1 to M6. Such a structure can prevent an increase in layout area due to the addition of the capacitors C1 and C2.

Note that the capacitors C1 and C2, which overlap with the transistors M1 to M6, are preferably provided in the same layer as an OS transistor of the memory cell MC. In the case of employing such a structure, it is preferred that one electrode of the capacitor be provided in the same layer as a gate electrode of the OS transistor and the other electrode of the capacitor be provided in the same layer as source and drain electrodes of the OS transistor. Such a structure allows an insulating layer between the electrodes of the capacitor to be formed using the same layer as a gate insulating layer in the OS transistor. The gate insulating layer is thinner than an interlayer insulating layer; thus, the capacitance value per unit area thereof can be increased.

Note that in this embodiment, when the potential of the node OUT is set at a low level, the potential of the wiring $WL_{ret}$ is at a low level because the buffer circuit BUF2 includes even-numbered stages of inverter circuits (two stages in FIG. 2A). In the case where the buffer circuit BUF2 includes odd-numbered stages of inverter circuits, the potential of the wiring $WL_{ret}$ is at a low level when the potential of the node OUT is at a high level. Therefore, the positions of the capacitors C1 and C2 are changed in accordance with the number of stages of the inverter circuits in the buffer circuit BUF2.

Figure 11A:
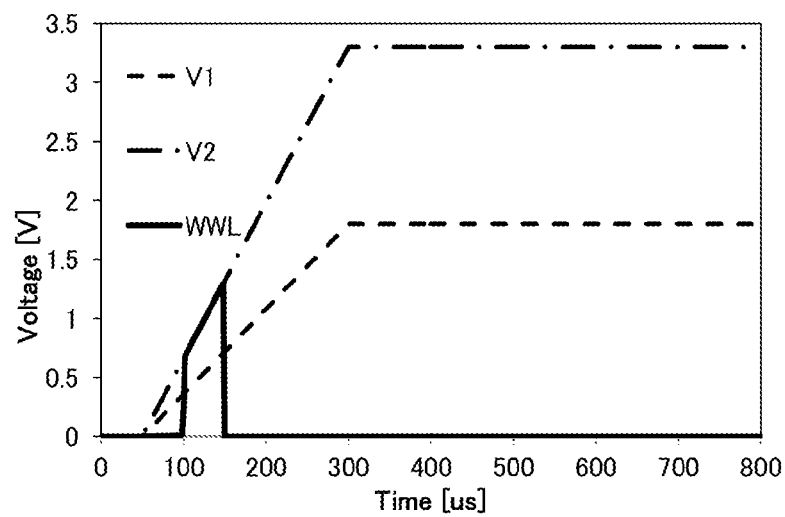
FIGS. 11A to 11C are graphs showing embodiments of the present invention.
Figure 11B:
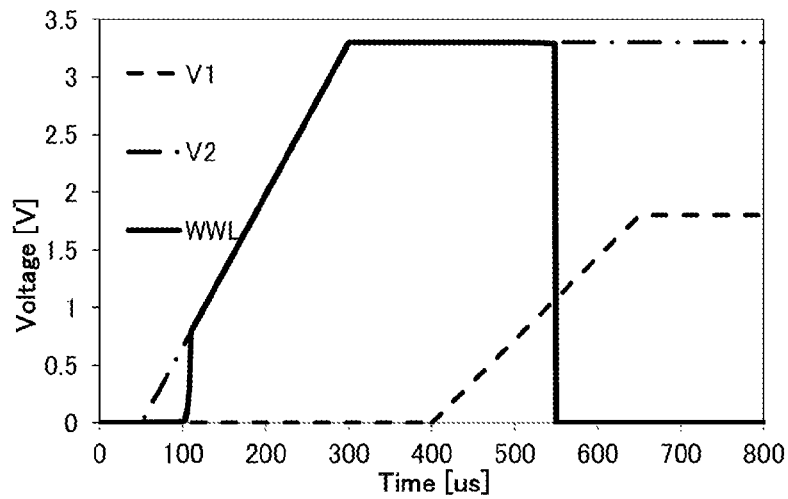
Figure 11C:
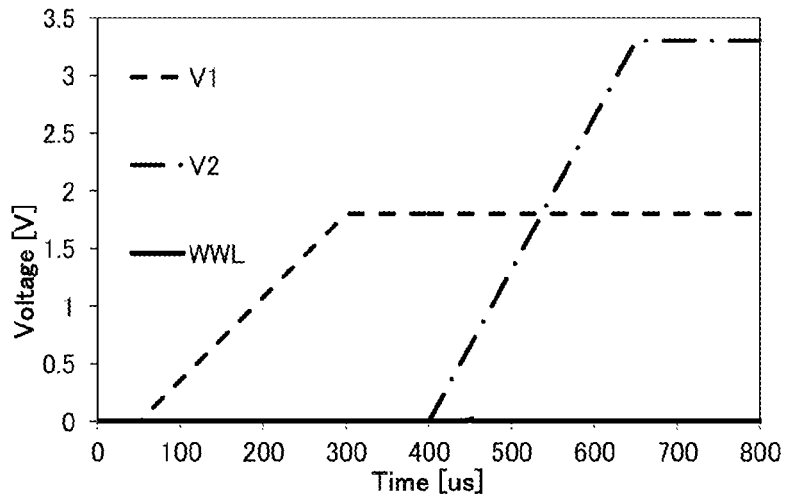

To verify the effect of one embodiment of the present invention described above, calculation was performed with a calculator. FIGS. 11A to 11C are graphs each showing variations in the voltage of the wiring $WL_{ret}$ when the voltages of the wirings VH1 and VH2 were raised from the ground voltage at different timings in the circuit diagram illustrated in FIG. 2A.

FIG. 11A shows variations in the voltage of the wiring $WL_{ret}$ (shown by the wiring WWL) when the voltages of the wirings VH1 and VH2 were raised from the ground voltage at the same timing. FIG. 11B shows variations in the voltage of the wiring $WL_{ret}$ (shown by the wiring WWL) when the voltage of the wiring VH2 was raised from the ground voltage earlier than that of the wiring VH1. FIG. 11C shows variations in the voltage of the wiring $WL_{ret}$ (shown by the wiring WWL) when the voltage of the wiring VH1 was raised from the ground voltage earlier than that of the wiring VH2. Note that in FIGS. 11A to 11C, "V1" represents the voltage of the wiring VH1, and "V2" represents the voltage of the wiring VH2.

FIGS. 11A to 11C indicate that the voltage of the wiring WWL varied when the voltages of the wirings VH1 and VH2 were raised from the ground voltage at the same timing and when the voltage of the wiring VH2 was raised from the ground voltage earlier than that of the wiring VH1. In contrast, when the voltage of the wiring VH1 was raised from the ground voltage earlier than that of the wiring VH2, the voltage of the wiring WWL was constantly 0 V, which is the ground voltage. Therefore, when the voltage of the wiring VH1 was raised from the ground voltage earlier than that of the wiring VH2, there was an effect that the potential of the wiring $WL_{ret}$ was able to be kept at a low level.

Embodiment 2

In this embodiment, modification examples of the output circuit described in Embodiment 1, examples of the memory cell MC, examples of a semiconductor device including the memory cell MC, and modification examples of the memory cell MC will be described.

Modification Examples of Output Circuit

FIG. 4 to FIG. 7, FIGS. 8A to 8F, and FIG. 28 illustrate modification examples of circuit configurations that can be employed for the output circuit illustrated in FIGS. 1A and 1B.

Figure 4:
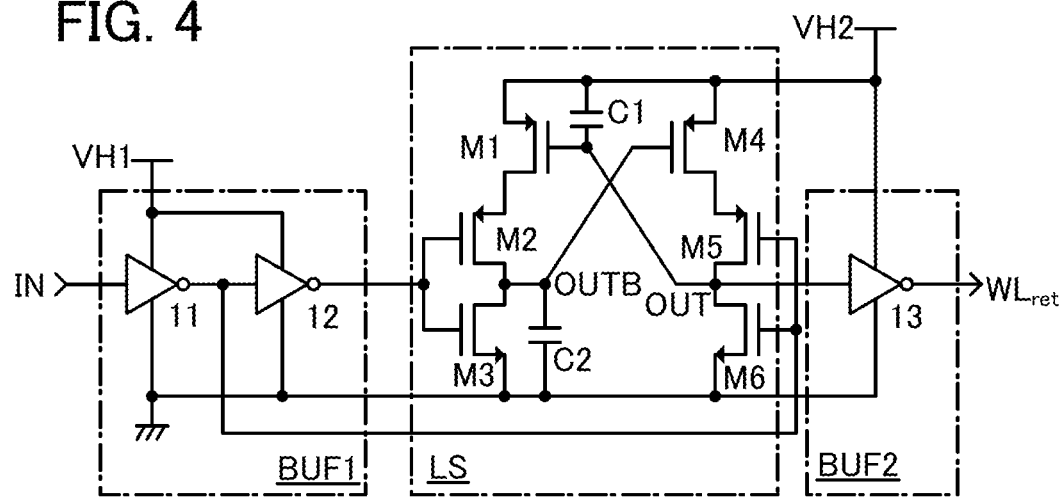
FIG. 4 is a circuit diagram illustrating one embodiment of the present invention.

FIG. 4 is a circuit diagram different from that in FIG. 3 in the positions of the capacitors C1 and C2 and the number of the inverter circuits in the buffer circuit BUF2 (one inverter circuit is provided in the buffer circuit BUF2 in FIG. 4). In the circuit diagram in FIG. 4, the capacitor C1 is provided between the wiring VH2 and the node OUT, and the capacitor C2 is provided between a ground line and the node OUTB.

The configuration in FIG. 4 allows the potential of the node OUT to be increased to a high-level potential at the timing when the voltage VDD2 is applied to the wiring VH2. The potentials of the node OUT and the wiring VH2 are increased because of capacitive coupling caused by the capacitor C1, and the transistor M1 can be turned off more reliably. The potential of the node OUT is set to a high-level potential, whereby a signal output to the wiring $WL_{ret}$ through the inverter circuit 13 can be kept at a low level.

Figure 5:
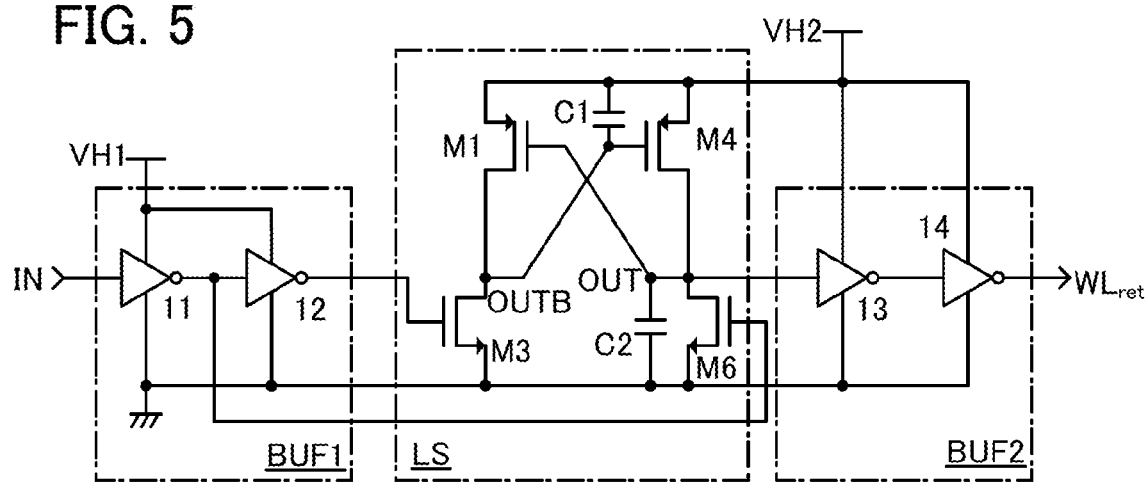
FIG. 5 is a circuit diagram illustrating one embodiment of the present invention.

The configuration of a circuit diagram illustrated in FIG. 5 is different from that illustrated in FIG. 2A in that the transistors M2 and M5 are not provided. Even in the case where the number of transistors is reduced as in FIG. 5, variations in the potentials of the nodes OUT and OUTB can be inhibited. Thus, data loss can be prevented from being caused by a high-level potential output to the wiring $WL_{ret}$, and the number of components of a semiconductor device can be reduced.

Figure 6:
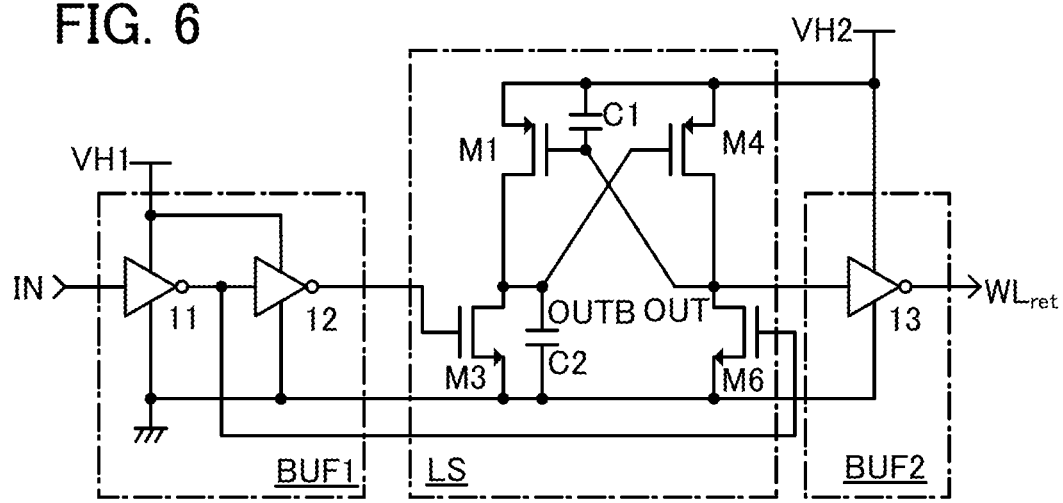
FIG. 6 is a circuit diagram illustrating one embodiment of the present invention.

The configuration without the transistors M2 and M5 illustrated in FIG. 5 can be used for the configuration of the circuit diagram illustrated in FIG. 4 as illustrated in FIG. 6. That is, the transistors can be omitted also in the configuration where the positions of the capacitors C1 and C2 are changed and the buffer circuit BUF2 includes one inverter circuit. Thus, data loss can be prevented from being caused by a high-level potential output to the wiring WL$_{ret}$, and the number of components of a semiconductor device can be reduced.

Figure 7:
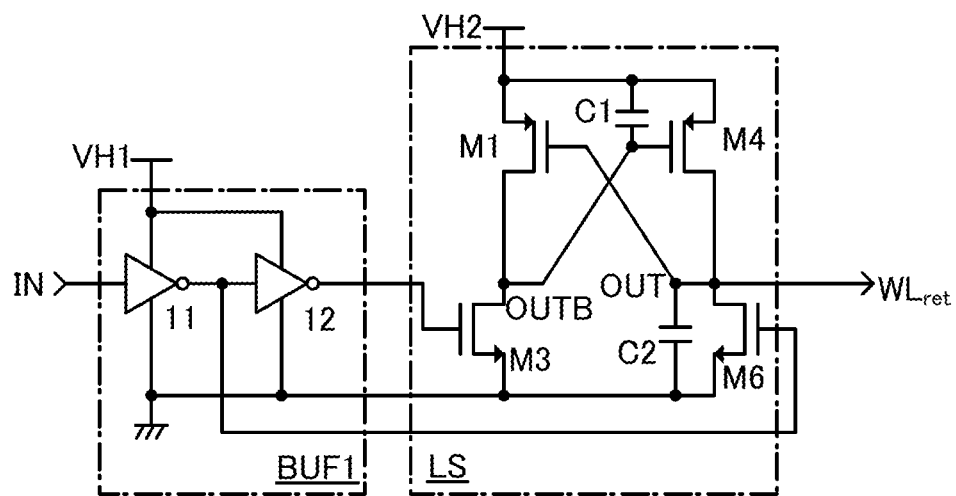
FIG. 7 is a circuit diagram illustrating one embodiment of the present invention.

Note that when the channel widths of the transistors M4 and M6 are larger than those of the transistors M1 and M3 in the configuration illustrated in FIG. 5, the transistors M4 and M6 function as a buffer circuit, and the buffer circuit BUF2 can be omitted as illustrated in FIG. 7. FIG. 7 is a circuit diagram illustrating an output circuit without the buffer circuit BUF2. Thus, data loss can be prevented from being caused by a high-level potential output to the wiring WL$_{ret}$, and the number of components of a semiconductor device can be reduced.

Figure 28:
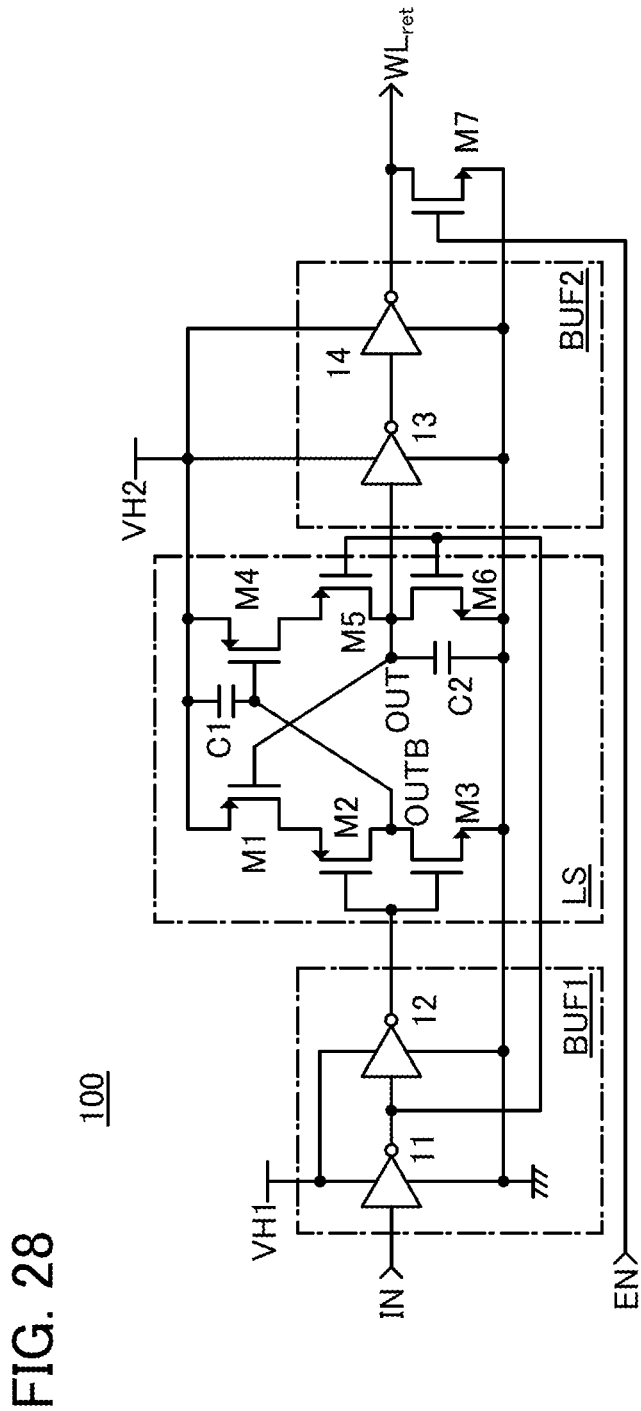
FIG. 28 is a circuit diagram illustrating one embodiment of the present invention.

Note that a transistor M7 may be additionally provided as in the configuration illustrated in FIG. 28. The transistor M7 is controlled by a control signal EN so as to be on when the potential of the wiring WL$_{ret}$ is a low-level potential. This configuration more reliably allows the potential of the wiring WL$_{ret}$ to be a low-level potential.

Examples of Memory Cell MC

FIGS. 8A to 8F each illustrate a circuit configuration example that the memory cell MC illustrated in FIG. 1A can have. In the circuit diagrams of memory cells illustrated in FIGS. 8A to 8F, a data voltage is written from a wiring SL or the wiring BL, and controlling the voltages of the wiring WWL and a wiring RWL can control writing or reading out of the data voltage.

Figure 8A:
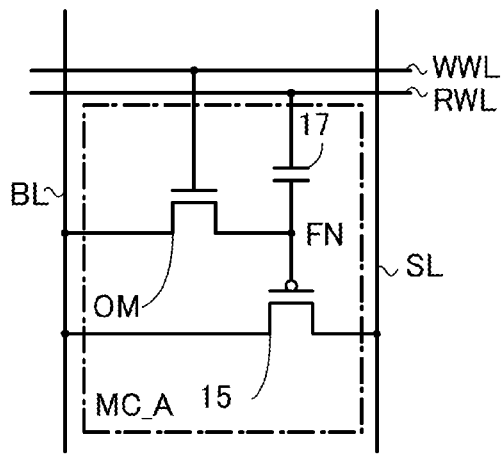
FIGS. 8A to 8F are circuit diagrams illustrating embodiments of the present invention.

A memory cell MC_A illustrated in FIG. 8A includes a transistor 15, the transistor OM, and a capacitor 17. The transistor 15 is a p-channel transistor. Turning off the transistor OM allows a charge depending on the data voltage to be stored in a node FN. The configuration in FIG. 8A can be used for the memory cell MC in FIG. 1A.

Figure 8B:
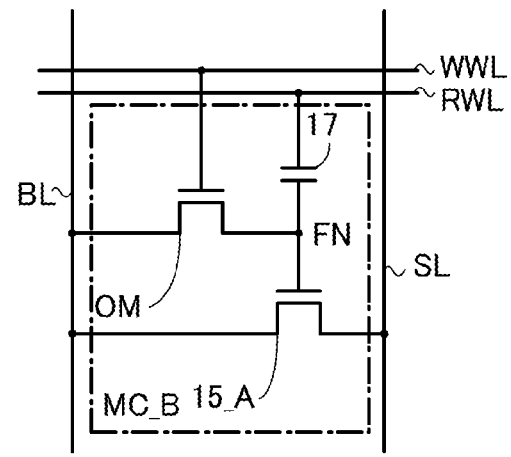

A memory cell MC_B illustrated in FIG. 8B includes a transistor 15_A, the transistor OM, and the capacitor 17. The transistor 15_A is an n-channel transistor. Turning off the transistor OM allows a charge depending on the data voltage to be stored in a node FN. The configuration in FIG. 8B can be used for the memory cell MC in FIG. 1A.

Figure 8C:
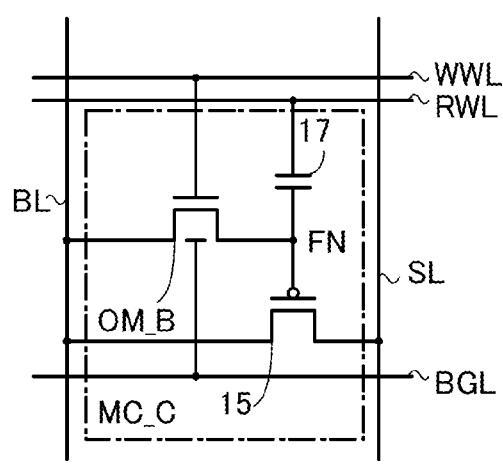

A memory cell MC_C illustrated in FIG. 8C includes the transistor 15, a transistor OM_B, and the capacitor 17. The transistor OM_B includes a back gate that can be controlled by a wiring BGL. This configuration enables control of the threshold voltage of the transistor OM_B. Turning off the transistor OMB allows a charge depending on the data voltage to be stored in the node FN. The configuration in FIG. 8C can be used for the memory cell MC in FIG. 1A.

Figure 8D:
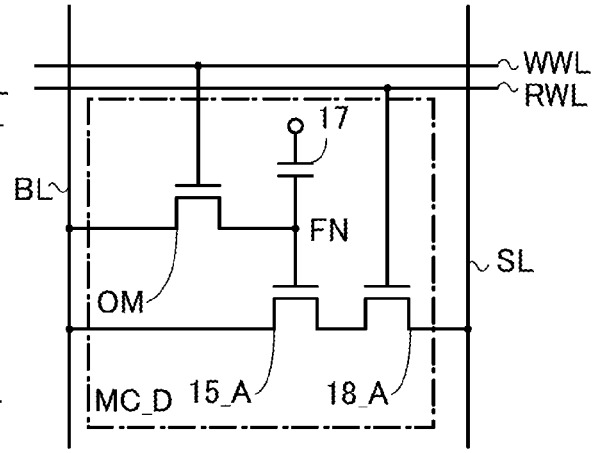
Figure 27A:
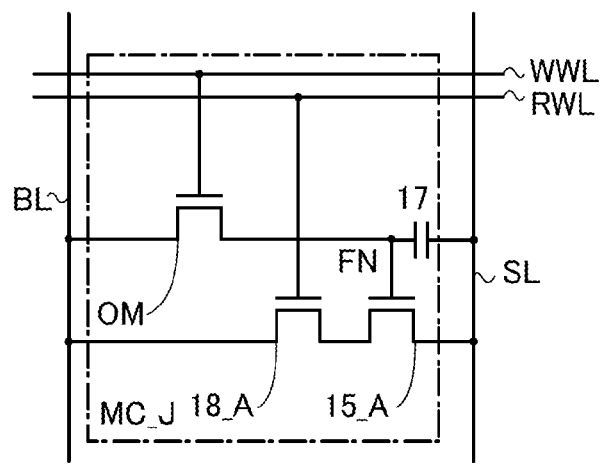
FIGS. 27A to 27C are circuit diagrams illustrating embodiments of the present invention.

A memory cell MC_D illustrated in FIG. 8D includes the transistor 15_A, the transistor OM, the capacitor 17, and a transistor 18_A. The transistor 18_A is an n-channel transistor like the transistor 15_A. Turning off the transistor OM allows a charge depending on the data voltage to be stored in the node FN. The configuration in FIG. 8D can be used for the memory cell MC in FIG. 1A. Note that the position of the transistor 18_A may be changed as in the circuit diagram illustrated in FIG. 27A.

Figure 8E:
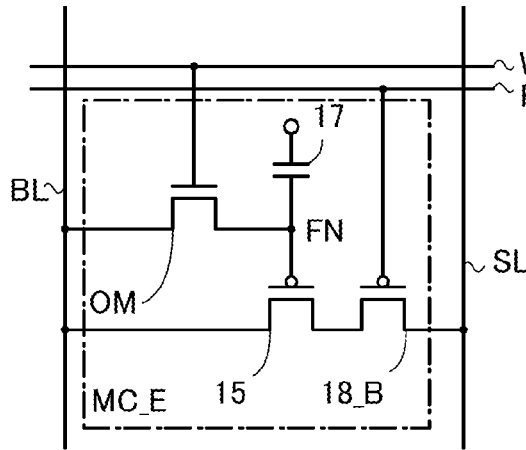
Figure 27B:
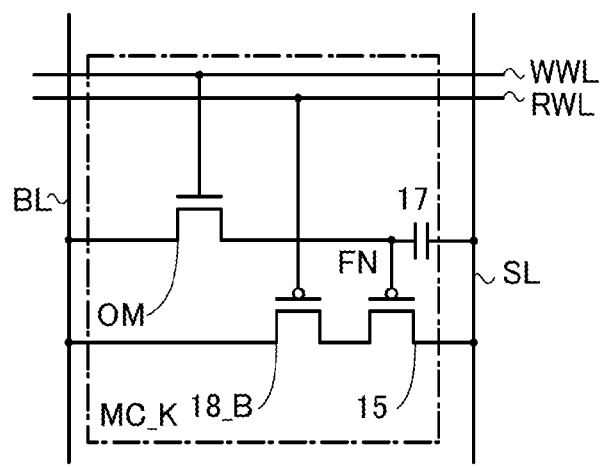

A memory cell MC_E illustrated in FIG. 8E includes the transistor 15, the transistor OM, the capacitor 17, and a transistor 18_B. The transistor 18_B and the transistor 15 are p-channel transistors. Turning off the transistor OM allows a charge depending on the data voltage to be stored in the node FN. The configuration in FIG. 8E can be used for the memory cell MC in FIG. 1A. Note that the position of the transistor 18_B may be changed as in the circuit diagram of a memory cell MC_K illustrated in FIG. 27B.

Figure 8F:
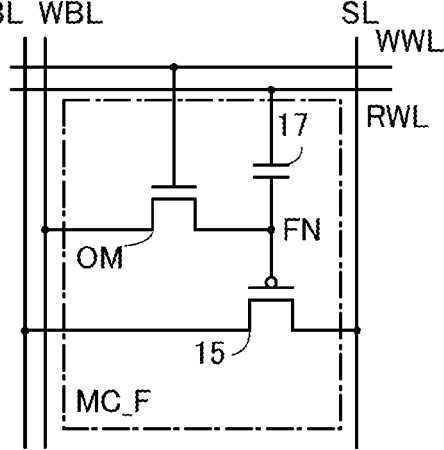
Figure 27C:
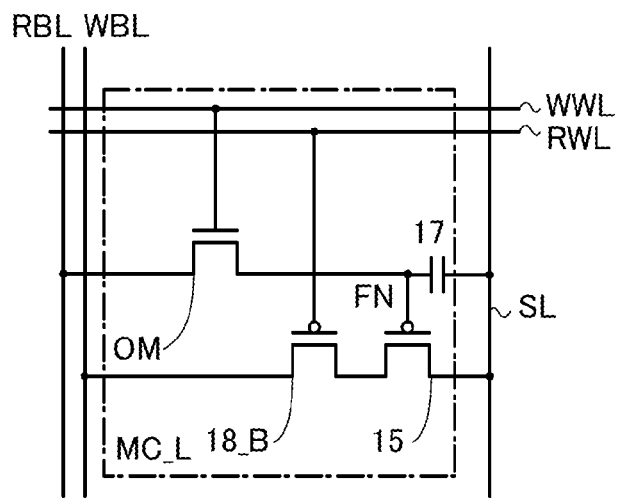

A memory cell MC_F illustrated in FIG. 8F includes the transistor 15, the transistor OM, and the capacitor 17. The transistor 15 is connected to a wiring BL_A, and the transistor OM is connected to a wiring BL_B. In the configuration illustrated in FIG. 8F, for example, a wiring RBL can be used to read out a data voltage, and the wiring WBL can be used to write a data voltage. Turning off the transistor OM allows a charge depending on the data voltage to be stored in the node FN. The configuration in FIG. 8F can be used for the memory cell MC in FIG. 1A. Note that the transistor 18_B may be additionally provided as in the circuit diagram of a memory cell MC_L illustrated in FIG. 27C.

Example of Block Diagram Including Memory Cell MC

Figure 9:
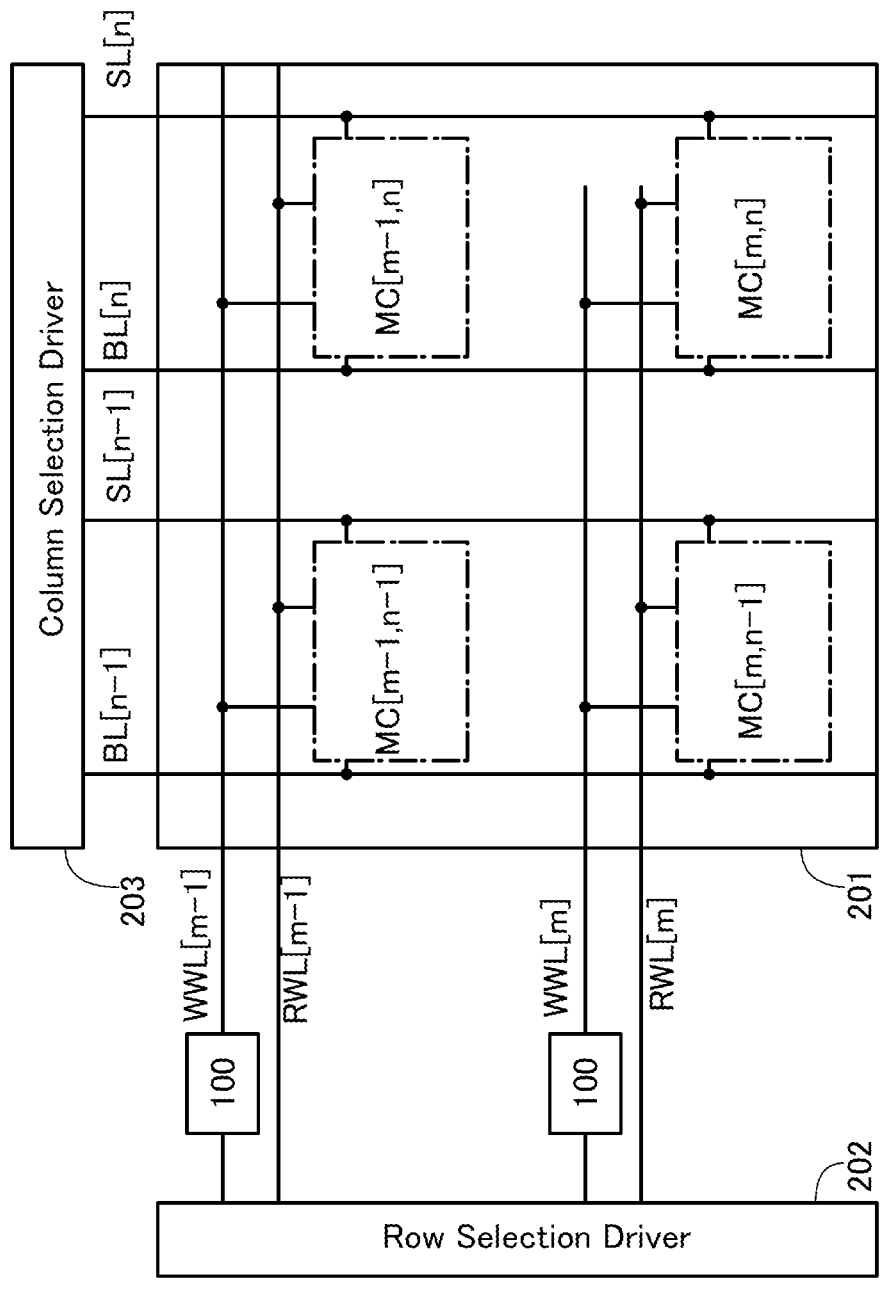
FIG. 9 is a block diagram illustrating one embodiment of the present invention.

FIG. 9 is a block diagram illustrating a configuration example of a semiconductor device using the memory cell MC_A in FIG. 8A as the memory cell MC illustrated in FIG. 1A.

A semiconductor device 200 illustrated in FIG. 9 includes a memory cell array 201 provided with a plurality of memory cells MC, the output circuit 100, a row selection driver 202, and a column selection driver 203. Note that in the semiconductor device 200, the memory cells MC are arranged in a matrix of m rows and n columns. In addition, in FIG. 9, a wiring WWL[m−1] and a wiring RWL[m−1] in an (m−1)-th row, a wiring WWL[m] and a wiring RWL[m] in an m-th row, a wiring BL[n−1] and a wiring SL[n−1] in an (n−1)-th column, and a wiring BL[n] and a wiring SL[n] in an n-th column are illustrated as wirings WWL, wirings RWL, wirings BL, and wirings SL.

In the memory cell array 201 illustrated in FIG. 9, the memory cells MC are arranged in a matrix. Note that for components of the memory cell MC, the description of those in FIG. 8A can be referred to.

Note that in the memory cell array 201 illustrated in FIG. 9, the output circuit 100 is provided between the row selection driver 202 for outputting a write word signal and each of the wiring WWL[m−1] and the wiring WWL[m]. Such a configuration enables supply of a signal output from the output circuit 100 to a gate of the transistor OM included in the memory cell MC.

The row selection driver 202 is a circuit that outputs a signal for selecting the memory cell MC in each row. The column selection driver 203 is a circuit that outputs a signal for writing a data voltage to the memory cell MC and reading out the data voltage from the memory cell MC. The row selection driver 202 and the column selection driver 203 include circuits such as a decoder and can output a signal or a data voltage to each row and each column.

Modification Examples of Memory Cell MC

Figure 10A:
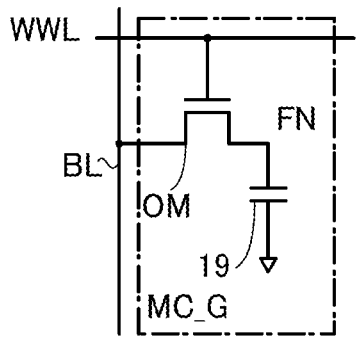
FIGS. 10A to 10C are circuit diagrams illustrating embodiments of the present invention.
Figure 10B:
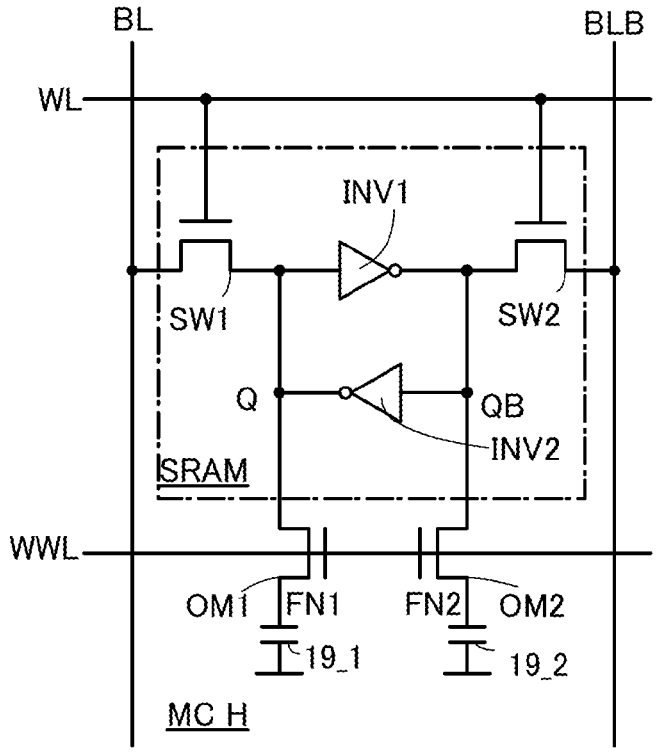
Figure 10C:
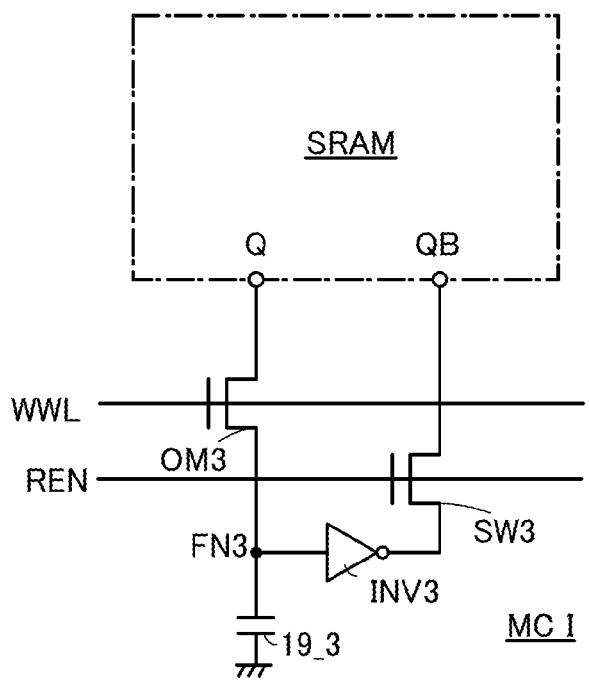

FIGS. 10A to 10C illustrate circuit configuration examples different from those in FIGS. 8A to 8F that the memory cell MC illustrated in FIG. 1A can have.

A memory cell MC_G illustrated in FIG. 10A includes the transistor OM and a capacitor 19. The memory cell MC_G controls the voltage of the wiring WWL so that a data voltage is written from the wiring BL to the node FN and the data voltage is read out from the node FN to the wiring BL. Turning off the transistor OM allows a charge depending on the data voltage to be stored in the node FN. The configuration in FIG. 10A can be used for the memory cell MC in FIG. 1A.

A memory cell MC_H illustrated in FIG. 10B includes an SRAM, a transistor OM1, a transistor OM2, a capacitor 19_1, and a capacitor 19_2. The SRAM includes transistors SW1 and SW2 and inverter circuits INV1 and INV2. The memory cell MC_H controls the voltage of the wiring WWL so that the data voltages of the nodes Q and QB of the SRAM are backed up in nodes FN1 and FN2 and the data voltages are recovered from the nodes FN1 and FN2 to the nodes Q and QB. Turning off the transistors OM1 and OM2 allows charges depending on the data voltages to be stored in the nodes FN1 and FN2. The configuration in FIG. 10B can be used for the memory cell MC in FIG. 1A.

A memory cell MC_I illustrated in FIG. 10C includes an SRAM, a transistor OM3, an inverter circuit INV3, a capacitor 19_3, and a transistor SW3. The memory cell MC_I controls the voltages of the wiring WWL and a wiring REN so that the data voltages of the nodes Q and QB of the SRAM are backed up in a node FN3 and the data voltages are recovered from the node FN3 to the nodes Q and QB. Turning off the transistor OM3 allows a charge depending on the data voltage to be stored in the node FN3. The configuration in FIG. 10C can be used for the memory cell MC in FIG. 1A.

As described above, any of a variety of modification examples can be employed as one embodiment of the present invention and operated.

Embodiment 3

In this embodiment, the OS transistor described in the above embodiment will be described.

<Off-State Current Characteristics>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $8 \times 10^{11}/cm^3$, preferably lower than $1 \times 10^{11}/cm^3$, more preferably lower than $1 \times 10^{10}/cm^3$, and is higher than or equal to $1 \times 10^{-9}/cm^3$. In the oxide semiconductor, hydrogen, nitrogen, carbon, silicon, and metal elements other than main components are impurities. For example, hydrogen and nitrogen form donor levels to increase the carrier density.

A transistor using an intrinsic or substantially intrinsic oxide semiconductor has a low carrier density and thus is less likely to have negative threshold voltage. Moreover, because of few carrier traps in the oxide semiconductor, the transistor using the oxide semiconductor has small variations in electrical characteristics and high reliability. Furthermore, the transistor using the oxide semiconductor has an ultra-low off-state current.

Note that the OS transistor with a reduced off-state current can exhibit a normalized off-state current per micrometer of channel width of $1 \times 10^{-18}$ A or less, preferably $1 \times 10^{-21}$ A or less, more preferably $1 \times 10^{-24}$ A or less at room temperature (approximately 25° C.), or $1 \times 10^{-15}$ A or less, preferably $1 \times 10^{-18}$ A or less, more preferably $1 \times 10^{-21}$ A or less at 85° C.

<Off-State Current>

Unless otherwise specified, an off-state current in this specification refers to a drain current of a transistor in the off state (also referred to as a non-conduction state and a cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to an off-state current at given Vgs, at Vgs in a given range, or at Vgs at which sufficiently low off-state current is obtained.

As an example, the assumption is made of an n-channel transistor where the threshold voltage Vth is 0.5 V and the drain current is $1 \times 10^{-9}$ A at a voltage Vgs of 0.5 V, $1 \times 10^{-13}$ A at a voltage Vgs of 0.1 V, $1 \times 10^{-19}$ A at a voltage Vgs of −0.5 V, and $1 \times 10^{-22}$ A at a voltage Vgs of −0.8 V. The drain current of the transistor is $1 \times 10^{-19}$ A or lower at a voltage Vgs of −0.5 V or at a voltage Vgs in the range of −0.8 V to −0.5 V; therefore, it may be said that the off-state current of the transistor is $1 \times 10^{-19}$ A or lower. Since there is Vgs at which the drain current of the transistor is $1 \times 10^{-22}$ A or lower, it may be said that the off-state current of the transistor is $1 \times 10^{-22}$ A or lower.

In this specification, the off-state current of a transistor with a channel width W is sometimes represented by a current value in relation to the channel width W or by a current value per given channel width (e.g., 1 μm). In the latter case, the off-state current may be represented with a unit meaning current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like including the transistor is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on the voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the reliability of a semiconductor device or the like including the transistor is ensured or Vds used in the semiconductor device or the like including the transistor. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of off-state current, a drain may be replaced with a source. That is, the off-state current sometimes refers to a current that flows through a source of a transistor in the off state.

In this specification, the term "leakage current" sometimes expresses the same meaning as an off-state current.

In this specification, the off-state current sometimes refers to a current that flows between a source and a drain when a transistor is off, for example.

<Composition of Oxide Semiconductor>

An oxide semiconductor used for the semiconductor layer of the OS transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

The oxide semiconductor layer used for the OS transistor can be formed using, for example, any of the following oxides: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, In:Ga:Zn=4:2:3, or In:Ga:Zn=2:1:3, or an oxide with an atomic ratio close to the above atomic ratios can be used.

<Impurities in Oxide Semiconductor>

If an oxide semiconductor film used for a semiconductor layer contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. It is therefore preferred that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferred that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density of lower than $8\times10^{11}/cm^3$, preferably lower than $1\times10^{11}/cm^3$, more preferably lower than $1\times10^{10}/cm^3$ and higher than or equal to $1\times10^{-9}/cm^3$.

<Structure of Oxide Semiconductor>

Next, the structure of an oxide semiconductor will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a single crystal oxide semiconductor film and a non-single-crystal oxide semiconductor film. Alternatively, an oxide semiconductor is classified into a crystalline oxide semiconductor and an amorphous oxide semiconductor, for example.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. Examples of the crystalline oxide semiconductor include a single crystal oxide semiconductor, a CAAC-OS, a polycrystalline oxide semiconductor, and a microcrystalline oxide semiconductor.

First, a CAAC-OS film will be described.

A CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in the direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

On the other hand, according to the plan high-resolution TEM image of the CAAC-OS film observed in the direction substantially perpendicular to the sample surface, metal atoms are arranged in a triangular or hexagonal arrangement in the crystal parts. However, there is no regularity of arrangement of metal atoms between different crystal parts.

For example, when the structure of a CAAC-OS including an $InGaZnO_4$ crystal is analyzed by an out-of-plane method using an X-ray diffraction (XRD) apparatus, a peak may appear at a diffraction angle (2θ) of around 31°. This peak is derived from the (009) plane of the $InGaZnO_4$ crystal, which indicates that crystals in the CAAC-OS film have c-axis alignment, and that the c-axes are aligned in the direction substantially perpendicular to the formation surface or the top surface of the CAAC-OS film.

Note that in analysis of the CAAC-OS film by an out-of-plane method, another peak may appear when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film with low impurity concentration. The impurity is an element other than the main components of the oxide semiconductor film, such as hydrogen, carbon, silicon, or a transition metal element. In particular, an element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor might serve as a carrier trap or a carrier generation source.

The CAAC-OS film is an oxide semiconductor having a low density of defect states. In some cases, oxygen vacancies in the oxide semiconductor film serve as carrier traps or serve as carrier generation sources when hydrogen is captured therein, for example.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not ordered. Accordingly, the nc-OS film cannot be distinguished from an amorphous oxide semiconductor film, depending on an analysis method. For example, when the nc-OS film is subjected to structural analysis by an out-of-plane method with an XRD apparatus using an X-ray having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter close to or smaller than the size of a crystal part is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film will be described.

The amorphous oxide semiconductor film is an oxide semiconductor film having disordered atomic arrangement and no crystal part and exemplified by an oxide semiconductor film that exists in an amorphous state, such as quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak that shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. The growth of the crystal part occurs due to the crystallization of the a-like OS film, which is induced by a slight amount of electron beam employed in the TEM observation. In contrast, in the nc-OS film that have good quality, crystallization hardly occurs by a slight amount of electron beam used for TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film depends on the structure in some cases. For example, when the composition of an oxide semiconductor film is determined, the structure of the oxide semiconductor film can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of the single crystal oxide semiconductor film.

Specific examples of the above description will be given. For example, in the case of an oxide semiconductor film having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there is a possibility that an oxide semiconductor film having a certain composition cannot exist in a single crystal structure. In that case, single crystal oxide semiconductor films with different compositions are combined at an adequate ratio, which makes it possible to calculate density equivalent to that of a single crystal oxide semiconductor film with the desired composition. The density of a single crystal oxide semiconductor film having the desired composition can be calculated using a weighted average according to the combination ratio of the single crystal oxide semiconductor films with different compositions. Note that it is preferable to use as few kinds of single crystal oxide semiconductor films as possible to calculate the density.

Note that an oxide semiconductor film may be a stack including two or more of an amorphous oxide semiconductor film, an a-like OS film, a microcrystalline oxide semiconductor film, and a CAAC-OS film, for example.

As described above, the OS transistor has extremely favorable off-state current characteristics.

Embodiment 4

In this embodiment, examples of a schematic diagram of the output circuit described in the above embodiment, layout diagrams illustrating layers thereof, a layout diagram thereof, and a schematic cross-sectional view that corresponds to the layout diagram thereof will be described with reference to FIG. 12, FIGS. 13A to 13D, FIG. 14, and FIG. 15.

Figure 12:
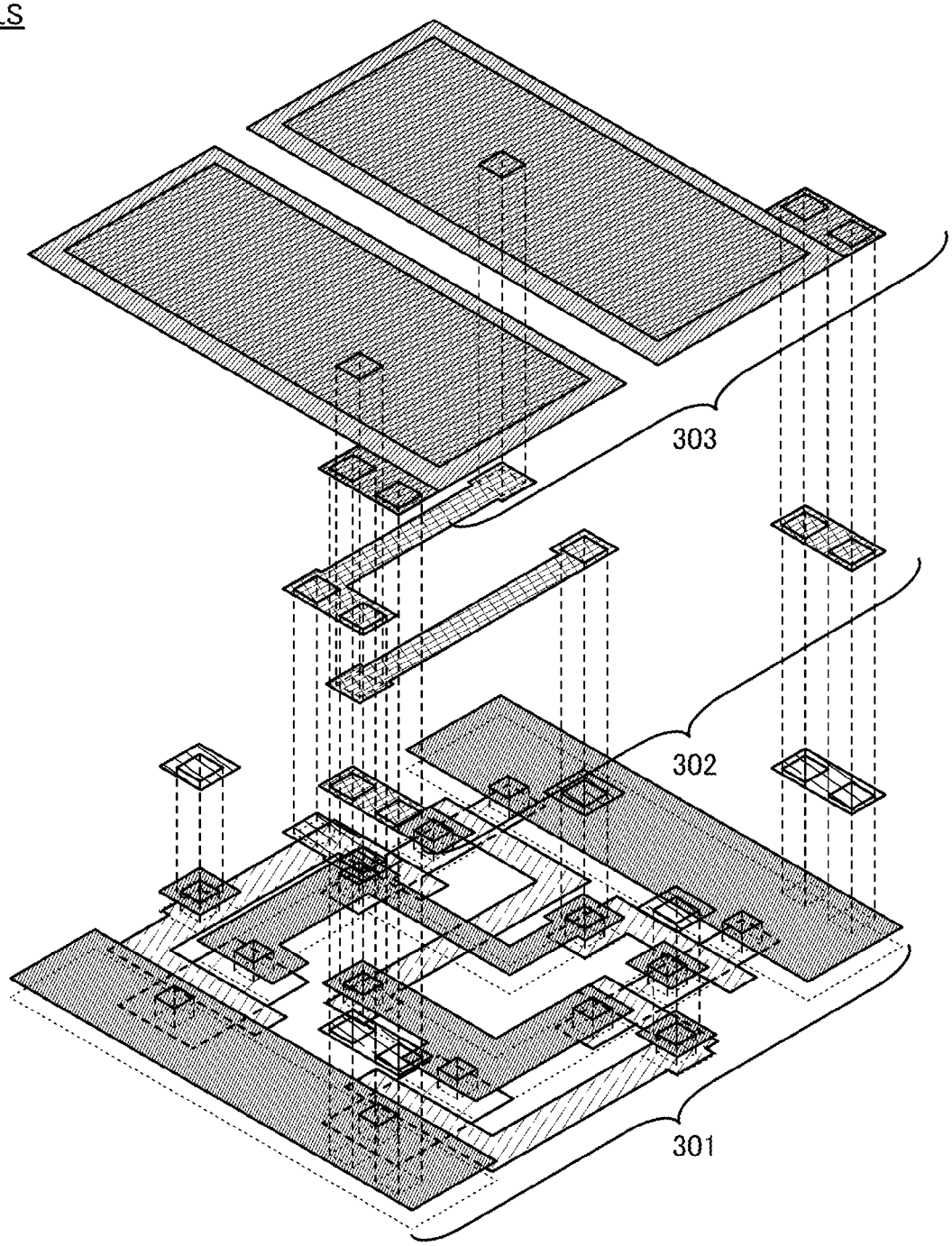
FIG. 12 is a schematic diagram illustrating one embodiment of the present invention.

FIG. 12 is a schematic diagram of the level shifter circuit LS of the output circuit. A layer 301 including a Si transistor, a wiring layer 302, a layer 303 including a capacitor are illustrated in FIG. 12. The layer 301 and the layer 303 are connected to each other through conductive layers that are provided in openings and the wiring layer 302. As illustrated in FIG. 12, the layer 301, the wiring layer 302, and the layer 303 can be provided so as to overlap with one another. Thus, such a level shifter LS has the advantage: additionally providing a capacitor to prevent data loss due to malfunction of a semiconductor device does not increase the layout area.

Figure 13A:
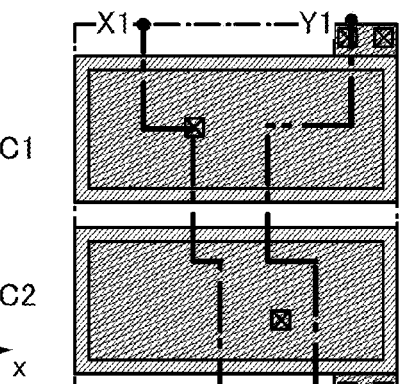
FIGS. 13A to 13D are layout diagrams illustrating an embodiment of the present invention.
Figure 13B:
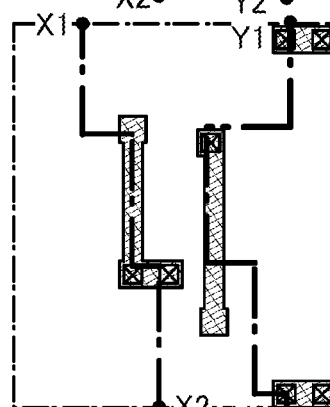
Figure 13C:
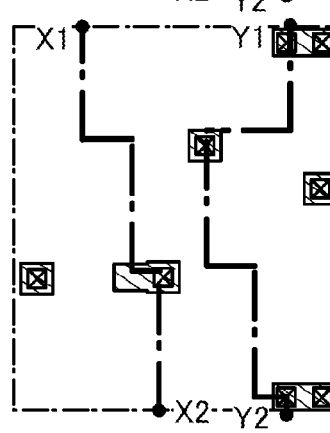
Figure 13D:
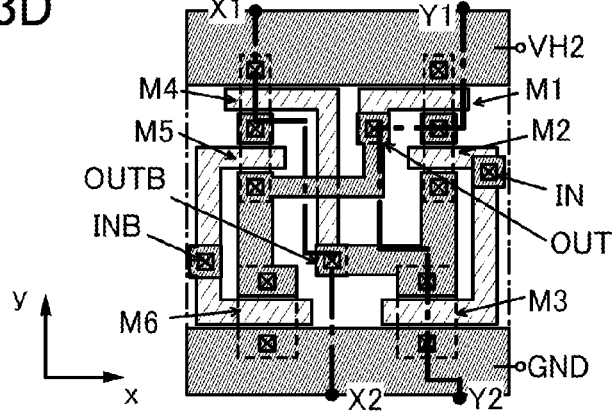

FIGS. 13A to 13D illustrate layers in the layout in FIG. 12. FIG. 13A illustrates the positions of conductive layers and openings in a layer including the capacitors C1 and C2. FIG. 13B illustrates the positions of conductive layers and openings in a wiring layer under the layer illustrated in FIG. 13A. FIG. 13C illustrates the positions of conductive layers and openings in a wiring layer under the layer illustrated in FIG. 13B. FIG. 13D illustrates the positions of conductive layers and semiconductor layers included in the transistors M1 to M6, conductive layers corresponding to the wiring VH2 and the ground line, and openings in a layer under the layer illustrated in FIG. 13C. Furthermore, FIG. 13D illustrates terminals IN and INB and nodes OUT and OUTB.

Figure 15:
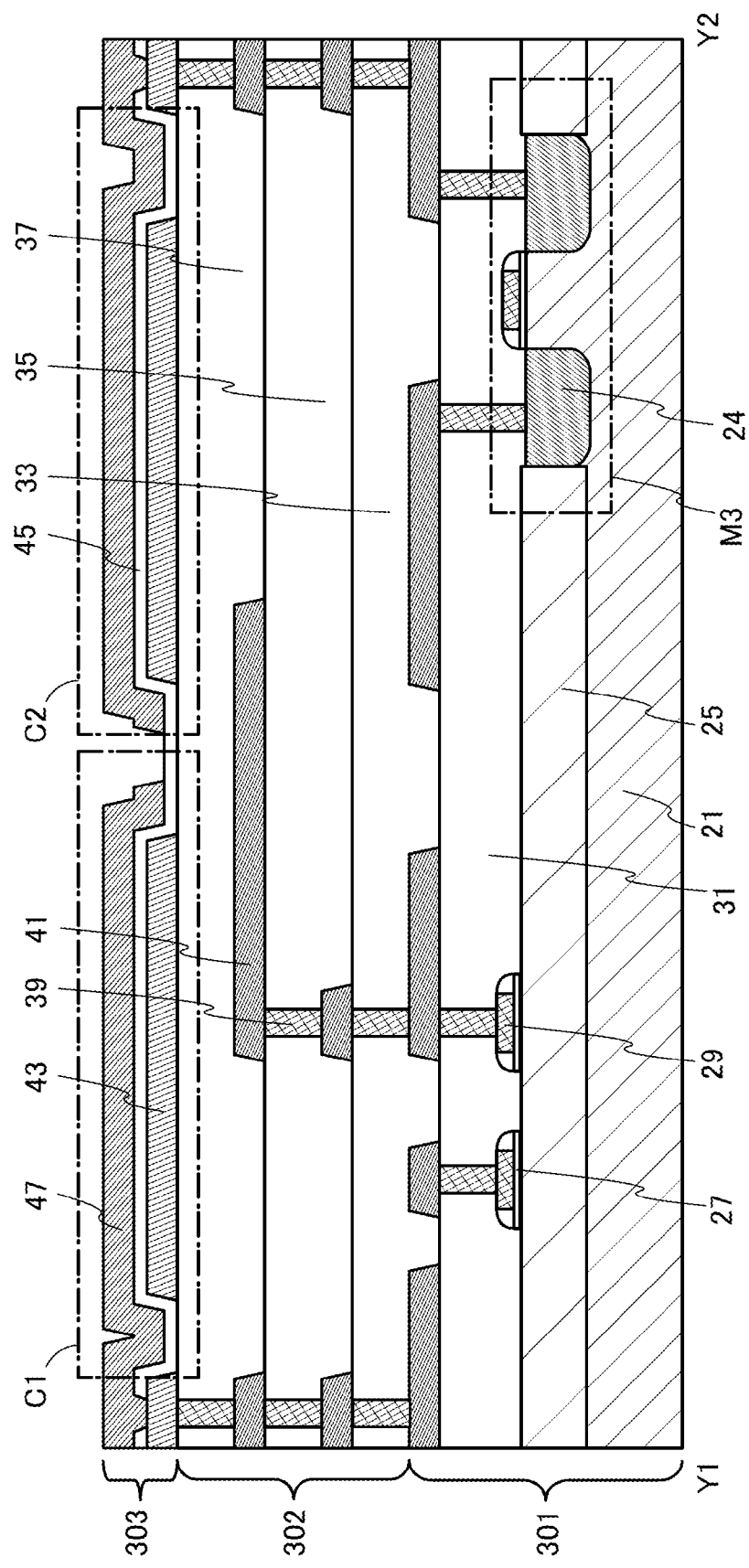
FIG. 15 is a schematic cross-sectional view illustrating one embodiment of the present invention.

FIG. 14 is a schematic cross-sectional view along dashed-dotted line X1-X2 in FIGS. 13A to 13D. FIG. 15 is a schematic view along dashed-dotted line Y1-Y2 in FIGS. 13A to 13D.

FIG. 14 and FIG. 15 illustrate a substrate 21, an impurity region 23, an impurity region 24, an insulating layer 25, an insulating layer 27, a conductive layer 29, an insulating layer 31, an insulating layer 33, an insulating layer 35, an insulating layer 37, a conductive layer 39, a conductive layer 41, a conductive layer 43, an insulating layer 45, and a conductive layer 47.

The substrate 21 can be, for example, a single crystal silicon substrate (a p-type semiconductor substrate or an n-type semiconductor substrate), a compound semiconductor substrate containing silicon carbide or gallium nitride, a silicon on insulator (SOI) substrate, or a glass substrate.

The impurity regions 23 and 24 are regions formed in the semiconductor layer. The semiconductor layer can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used. FIG. 14 and FIG. 15 illustrate the transistors M3 and M4 having different polarities. In this case, the n-channel transistor and the p-channel transistor are separately formed by introducing different impurities into the impurity regions 23 and 24.

A metal material such as aluminum, copper, titanium, tantalum, or tungsten is preferably used for each of the conductive layers 29, 39, 41, 43, and 47. Alternatively, polycrystalline silicon to which an impurity such as phosphorus is added can be used. As the formation method, any of a variety of film formation methods such as an evaporation method, a PE-CVD method, a sputtering method, and a spin coating method can be used.

Each of the insulating layers 25, 27, 31, 33, 35, 37, and 45 is preferably a single layer or a multilayer including an inorganic insulating layer or an organic insulating layer. The inorganic insulating layer is preferably a single layer or a multilayer formed using a silicon nitride film, a silicon oxynitride film, a silicon nitride oxide film, or the like. The organic insulating layer is preferably a single layer or a multilayer formed using a polyimide, an acrylic resin, or the like. There is no particular limitation on a method for forming each of the insulating layers; for example, a sputtering method, an MBE method, a PE-CVD method, a pulse laser deposition method, or an ALD method can be employed as appropriate.

Note that the conductive layer 43 is preferably provided in the same layer as a gate electrode of an OS transistor in the case where the capacitors C1 and C2 and the OS transistor are formed in the same layer. In addition, the conductive layer 47 is preferably provided in the same layer as a source electrode or a drain electrode of the OS transistor in the case where the capacitors C1 and C2 and the OS transistor are formed in the same layer. Such a structure enables the use of an insulating layer that is the same as a gate insulating layer of the OS transistor as the insulating layer 45 provided between the conductive layers 43 and 47. The gate insulating layer is thinner than the interlayer insulating layer; thus, the capacitors C1 and C2 can have larger capacitances.

Embodiment 5

Figure 16:
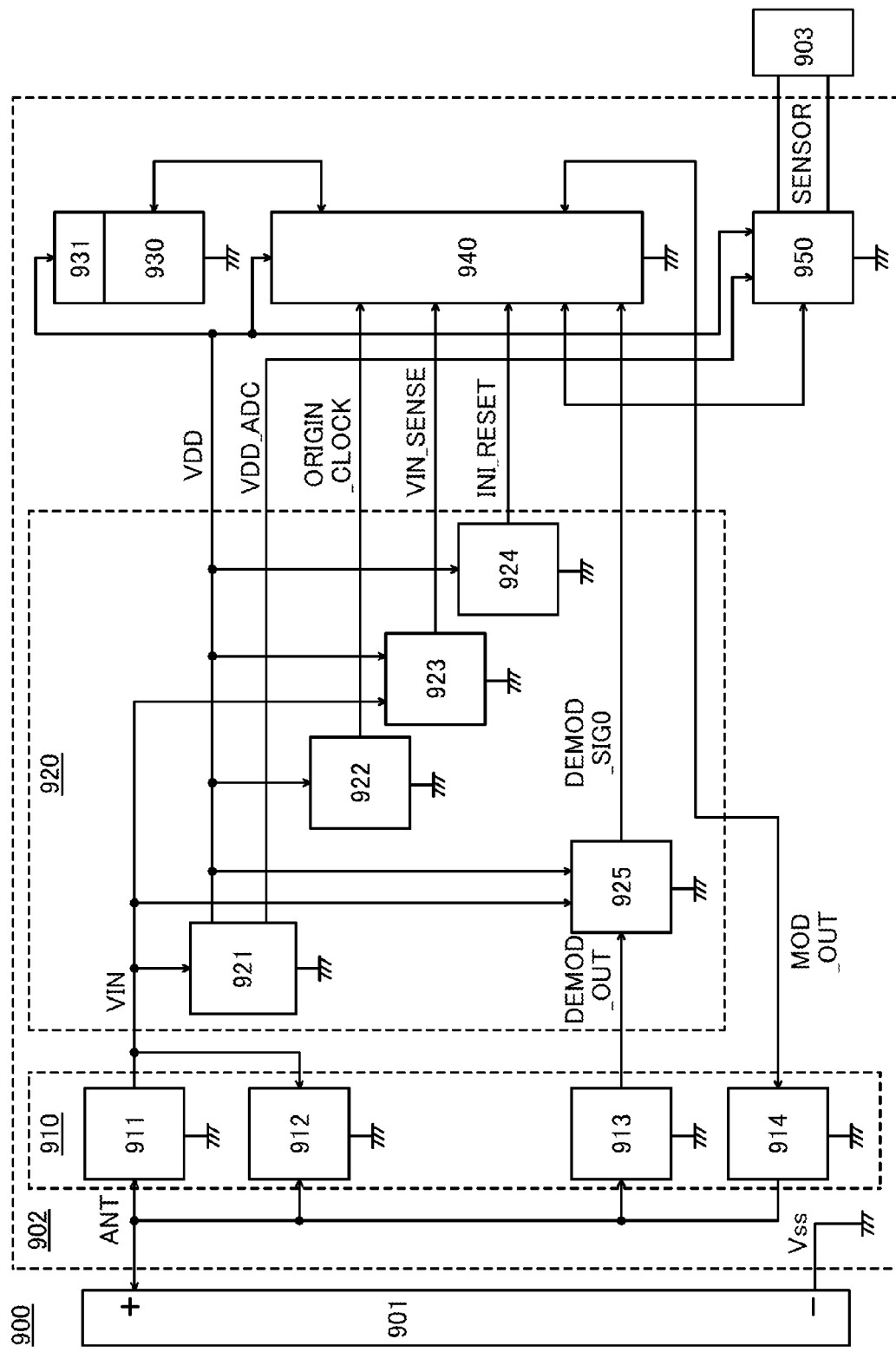
FIG. 16 is a block diagram illustrating one embodiment of the present invention.

FIG. 16 is a block diagram of a wireless sensor including the memory cell to which a signal is output from the output circuit that is described in the above embodiments.

A wireless sensor 900 includes an antenna 901, a circuit portion 902, and a sensor 903. The circuit portion 902 has a function of processing a signal received by the antenna 901, a function of generating response data in accordance with the received signal, and a function of sending the response data from the antenna 901. The circuit portion 902 includes, for example, an input/output portion (IN/OUT) 910, an analog portion 920, a memory portion 930, a logic portion 940, and an A/D converter 950.

<Input/Output Portion>

Figure 17A:
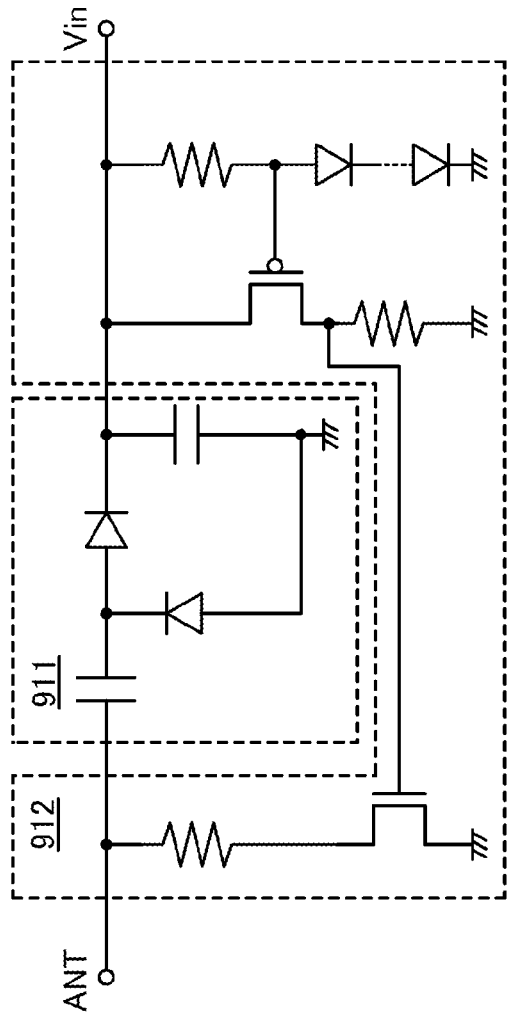
FIGS. 17A and 17B are circuit diagrams illustrating one embodiment of the present invention.
Figure 17B:
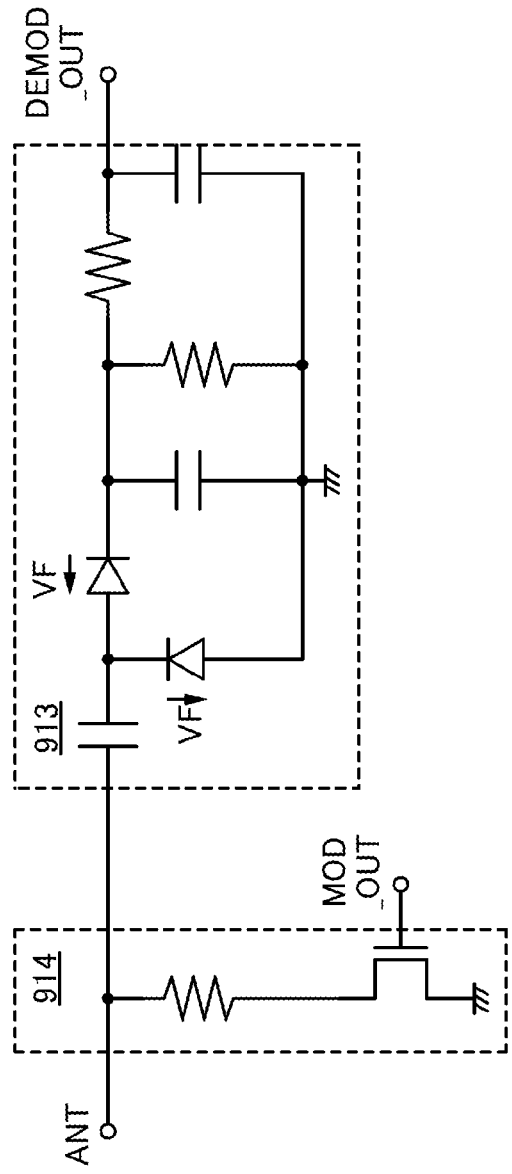

The input/output portion 910 includes a rectifier circuit 911, a limiter circuit 912, a demodulation circuit 913, and a modulation circuit 914. FIG. 17A is a circuit diagram illustrating a configuration example of the rectifier circuit 911 and the limiter circuit 912. FIG. 17B is a circuit diagram illustrating a configuration example of the demodulation circuit 913 and the modulation circuit 914.

The rectifier circuit 911 is a circuit that rectifies a signal (carrier wave ANT) input from the antenna 901 and generates a voltage VIN. The voltage VIN is output to the circuits in the analog portion 920.

The limiter circuit 912 is a protection circuit for preventing the voltage VIN from becoming high.

The demodulation circuit 913 is a circuit that demodulates the carrier wave ANT received by the antenna 901. The demodulation circuit 913 generates a demodulated signal DEMOD_OUT and outputs the signal to the analog portion 920.

The modulation circuit 914 is a circuit that modulates the response data (a digital signal) MOD_OUT output from the logic portion 940 and outputs the modulated data with the carrier wave ANT. The modulation method is, for example, the amplitude shift keying (ASK) method.

<Analog Portion>

The analog portion 920 includes a power supply circuit 921, an oscillator circuit 922, a voltage determination circuit 923, a reset circuit 924, and a buffer circuit 925.

Figure 18A:
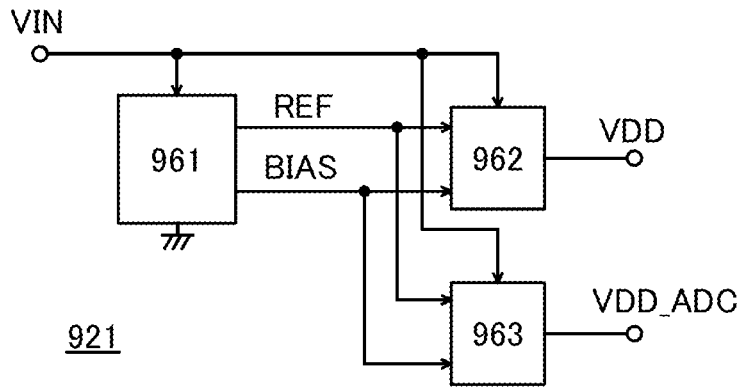
FIGS. 18A to 18C are circuit diagrams illustrating one embodiment of the present invention.

FIG. 18A is a block diagram illustrating a configuration example of the power supply circuit 921. The power supply circuit 921 is a circuit that generates an operating voltage for the memory portion 930, the logic portion 940, and the A/D converter 950. Here, the power supply circuit 921 generates two operating voltages (VDD and VDD_ADC) from the voltage VIN. The power supply circuit 921 includes a voltage generation circuit 961 that generates a bias voltage BIAS and a reference voltage REF from the voltage VIN, and voltage generation circuits 962 and 963 that generate the operating voltages from the voltage BIAS, the reference voltage REF, and the voltage VIN.

Figure 18B:
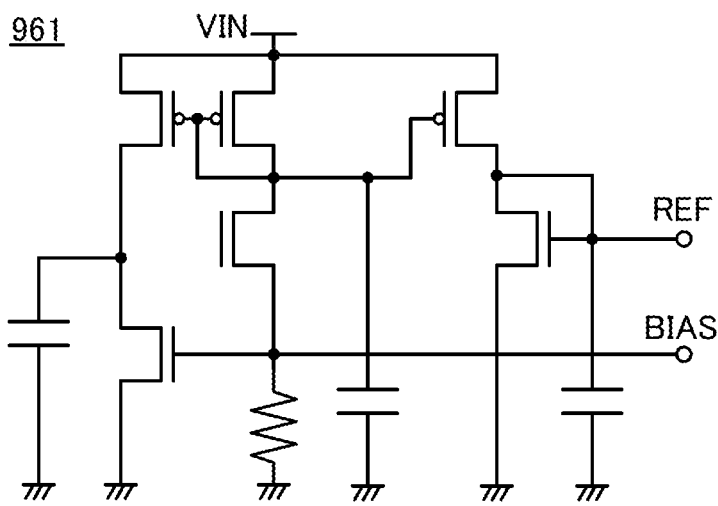
Figure 18C:
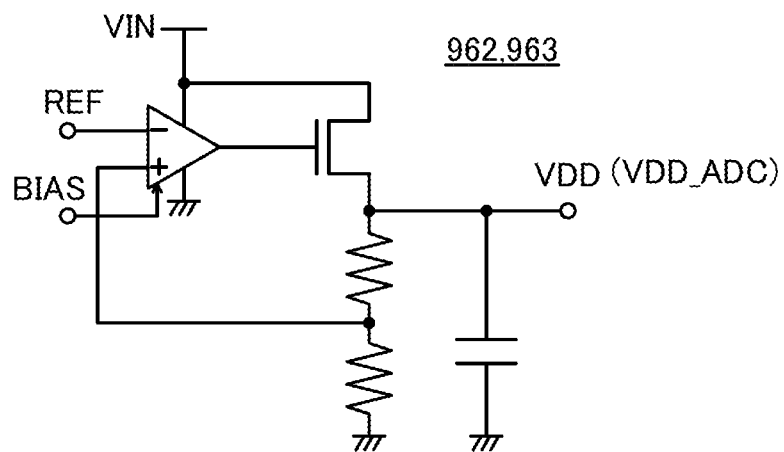

FIG. 18B is a circuit diagram illustrating a configuration example of the voltage generation circuit 961. FIG. 18C is a circuit diagram illustrating a configuration example of the voltage generation circuits 962 and 963.

Figure 19A:
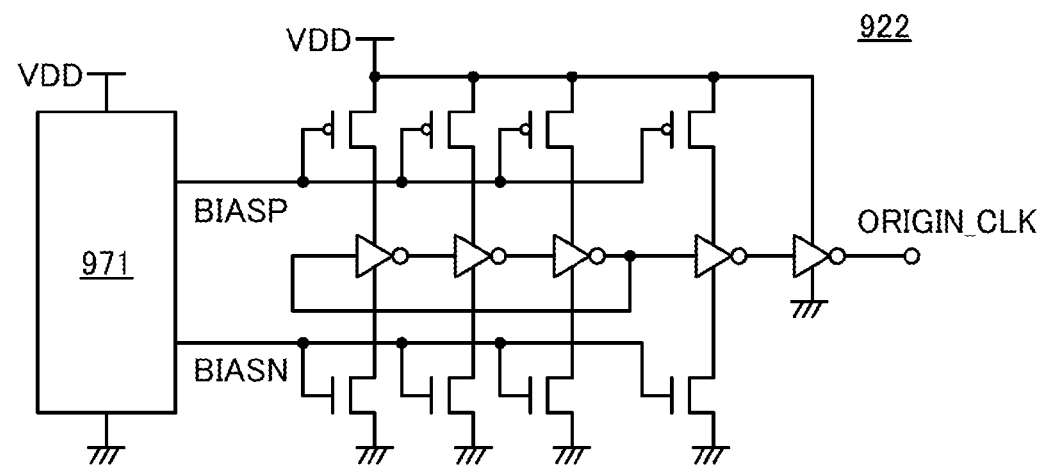
FIGS. 19A and 19B are circuit diagrams illustrating one embodiment of the present invention.
Figure 19B:
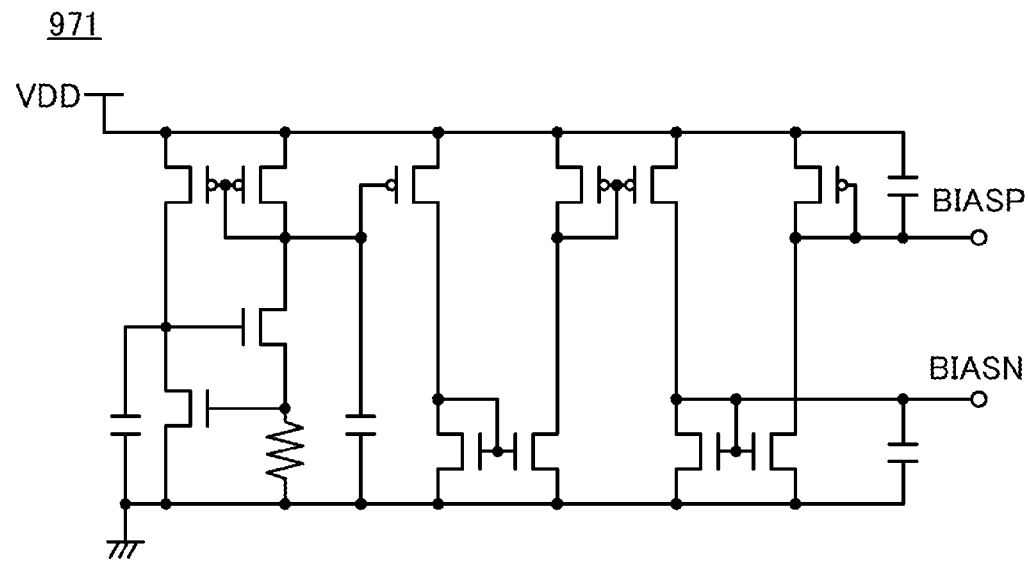

The oscillator circuit 922 is a circuit that generates a reference clock signal (ORIGIN_CLK) from the voltage VDD generated by the power supply circuit 921. FIG. 19A illustrates a configuration example of the oscillator circuit 922, and FIG. 19B illustrates a configuration example of a voltage generation circuit 971 that generates bias voltages (BIASP, BIASN) of the oscillator circuit 922.

Figure 20:
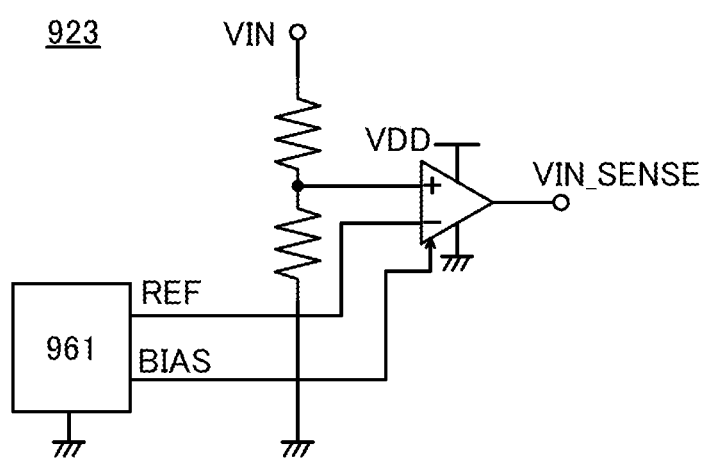
FIG. 20 is a circuit diagram illustrating one embodiment of the present invention.

FIG. 20 is a circuit diagram illustrating a configuration example of the voltage determination circuit 923. The voltage determination circuit 923 determines whether the voltage VIN is higher or lower than a predetermined value and generates a digital signal corresponding to the determination result. This digital signal is used as a trigger signal for operating the logic portion 940. The voltages BIAS and REF input to a comparator of the voltage determination circuit 923 are input from the voltage generation circuit 961 of the power supply circuit 921. In the example of FIG. 20, the voltage determination circuit 923 includes the comparator. The comparator generates and outputs a signal VIN_SENSE.

Figure 21:
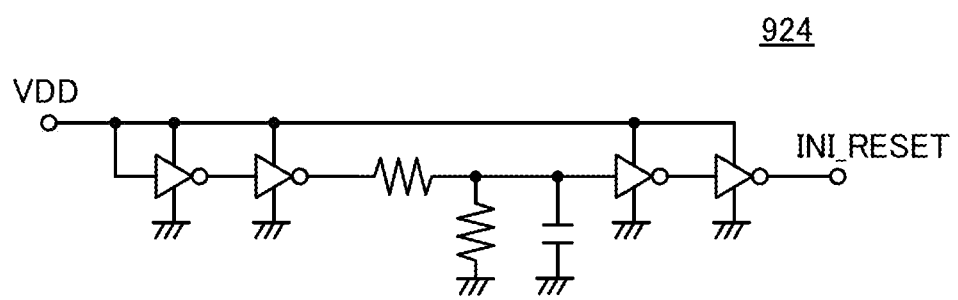
FIG. 21 is a circuit diagram illustrating one embodiment of the present invention.

The reset circuit 924 monitors the voltage generated by the power supply circuit 921 and generates a reset signal that resets the logic portion 940. FIG. 21 is a circuit diagram illustrating a configuration example of the reset circuit 924. In this example, the reset circuit 924 detects rising of the voltage VDD and generates a reset signal INI_RESET.

Figure 22:
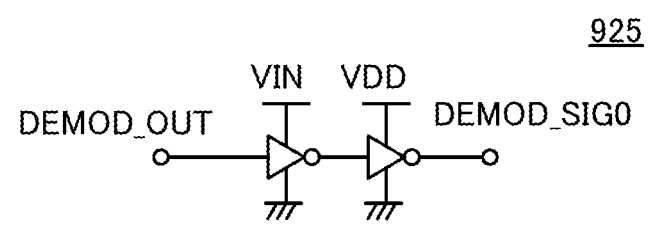
FIG. 22 is a circuit diagram illustrating one embodiment of the present invention.

The buffer circuit 925 is a circuit that transmits the signal DEMOD_OUT demodulated in the demodulation circuit 913 to the logic portion 940. FIG. 22 is a circuit diagram illustrating a configuration example of the buffer circuit 925. In the buffer circuit 925, the signal DEMOD_OUT is converted into a signal DEMOD_SIG0 through an inverter in the second stage, and is input to the logic portion 940.

<Memory Portion>

The memory portion 930 includes a charge pump circuit 931 in addition to a memory cell. For the configuration of the memory cell, Embodiment 1 can be referred to.

Figure 23:
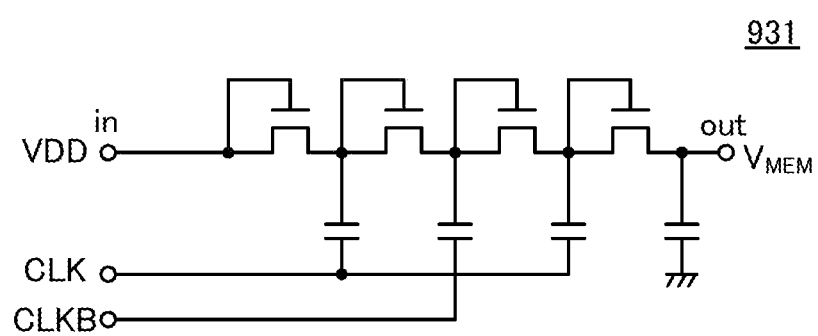
FIG. 23 is a circuit diagram illustrating one embodiment of the present invention.

The charge pump circuit 931 is a circuit that steps up the operating voltage VDD to generate a voltage required to operate the memory portion 930. FIG. 23 is a circuit diagram illustrating a configuration example of the charge pump circuit 931. In the charge pump circuit 931, the operating voltage VDD becomes a stepped-up voltage $V_{MEM}$ to be input to the memory circuit.

The voltage to be applied to the memory portion 930 is generated by the charge pump circuit 931, whereby the power consumption of the wireless sensor 900 can be reduced. The memory portion 930 operates at a higher voltage (2.5 V to 4 V) than other circuits. A configuration where the power supply circuit 921 generates a high voltage in advance and applies the voltage to the memory portion 930 can be used; however, this configuration increases power consumed in the power supply circuit 921, the oscillator circuit 922, or the voltage determination circuit and is not efficient. In contrast, in the configuration of FIG. 16, a low voltage (1.2 V) is generated by the power supply circuit 921 and stepped down or up by the charge pump circuit 931, which is immediately before the memory portion 930, to be used. Therefore, the power consumed by the wireless sensor 900 can be small, which is more efficient.

The output circuit described in Embodiment 1 is used in a driver circuit for driving the memory cell. Voltages are applied to the wiring VH1 and the wiring VH2 of the output circuit from the power supply circuit 921 and the charge pump circuit 931, respectively. The wireless sensor 900 generates a voltage in response to a wireless signal. Therefore, when the supply of a wireless signal is stopped, ground voltages are applied to the wirings VH1 and VH2. The wireless sensor is supplied with a wireless signal again and generates a voltage. Providing the output circuit can inhibit unintentional output of a high-level potential even when voltages are applied to the wirings VH1 and VH2, so that data loss from the memory cell can be prevented.

<Logic Portion>

Figure 24:
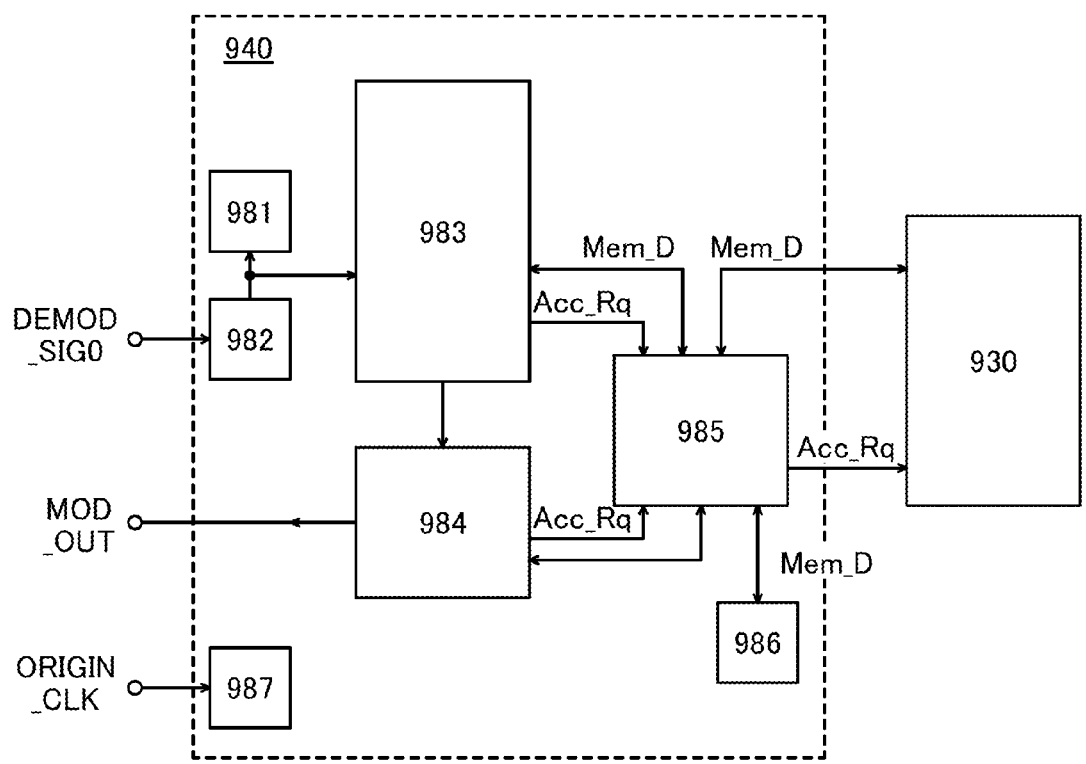
FIG. 24 is a block diagram illustrating one embodiment of the present invention.

FIG. 24 is a block diagram illustrating a configuration example of the logic portion 940. The logic portion 940 includes a CRC circuit 981, a decoder circuit 982, a controller 983, an output signal generation circuit 984, a selector circuit 985, a CRC register 986, and a clock generation circuit 987.

The decoder circuit 982 is a circuit that decodes the signal DEMOD_SIG0. The decoded signal is input to the controller 983 and the CRC circuit 981.

The CRC circuit 981 is a circuit that calculates a cyclic redundancy check (CRC) code from an input signal from the decoder circuit 982. The CRC code calculated by the CRC circuit 981 is output to the controller 983.

The controller 983 is a circuit that controls the entire logic portion 940.

The CRC register 986 is a register that functions as a CRC region for storing the CRC code.

The clock generation circuit 987 generates a clock signal used in the logic portion 940 from the signal ORIGIN_CLK.

The memory portion 930 and the CRC register 986 are accessed via the selector circuit 985. The controller 983 and the output signal generation circuit 984 output access request signals (Acc_Rq) to the selector circuit 985. The selector circuit 985 performs writing or reading of memory data (Mem_D) with respect to the memory portion 930 or the CRC register 986 in accordance with the access request signal.

<A/D Converter>

The A/D converter 950 converts a sensor signal SENSOR with an analog voltage output from the sensor 903 into a digital signal and outputs the signal.

The A/D converter 950 has a function of converting the potential of a sensor signal SENSOR, which is an analog value, into a digital value and outputting the digital value to the outside. As the A/D converter 950, a flash A/D converter, a successive approximation A/D converter, a multi-slope A/D converter, or a delta-sigma A/D converter can be used.

The wireless sensor described above can perform intermittent operation by receiving a wireless signal, without losing data stored in the memory portion 930.

Embodiment 6

Although the conductive layer and the semiconductor layer described in the above embodiments can be formed by a sputtering method, they may be formed by another method, for example, a thermal CVD method. Examples of a thermal CVD method include a metal organic chemical vapor deposition (MOCVD) method and an atomic layer deposition (ALD) method.

A thermal CVD method has an advantage that no defect due to plasma damage is generated because it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced such that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated more than once until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive film and the semiconductor film described in the above embodiments can be formed by a thermal CVD method such as a MOCVD method or an ALD method. For example, trimethylindium, trimethylgallium, and dimethylzinc are used to form an In—Ga—Zn—$O_X$ film (X>0). Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, when a tungsten film is formed with a deposition apparatus using ALD, a $WF_6$ gas and a $B_2H_6$ gas are sequentially introduced multiple times to form an initial tungsten film, and then a $WF_6$ gas and an $H_2$ gas are sequentially introduced multiple times, so that a tungsten film is formed. Note that a $SiH_4$ gas may be used instead of a $B_2H_6$ gas.

In the case where an oxide semiconductor film, for example, an $InGaZnO_X$ film (X>0) is formed with a deposition apparatus employing an ALD method, an $In(CH_3)_3$ gas and an $O_3$ gas are sequentially introduced more than once to form an $InO_2$ layer, a $Ga(CH_3)_3$ gas and an $O_3$ gas are sequentially introduced to form a GaO layer, and then a $Zn(CH_3)_2$ gas and an $O_3$ gas are sequentially introduced to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas that is obtained by bubbling with an inert gas such as Ar may be used instead of an $O_3$ gas, it is preferable to use an $O_3$ gas that does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Alternatively, a $Zn(CH_3)_2$ gas may be used.

Embodiment 7

In this embodiment, examples where the semiconductor devices described in the foregoing embodiment are used as an electronic component and an electronic device including the electronic component will be described with reference to FIGS. 25A and 25B and FIGS. 26A to 26E.

Figure 25A:
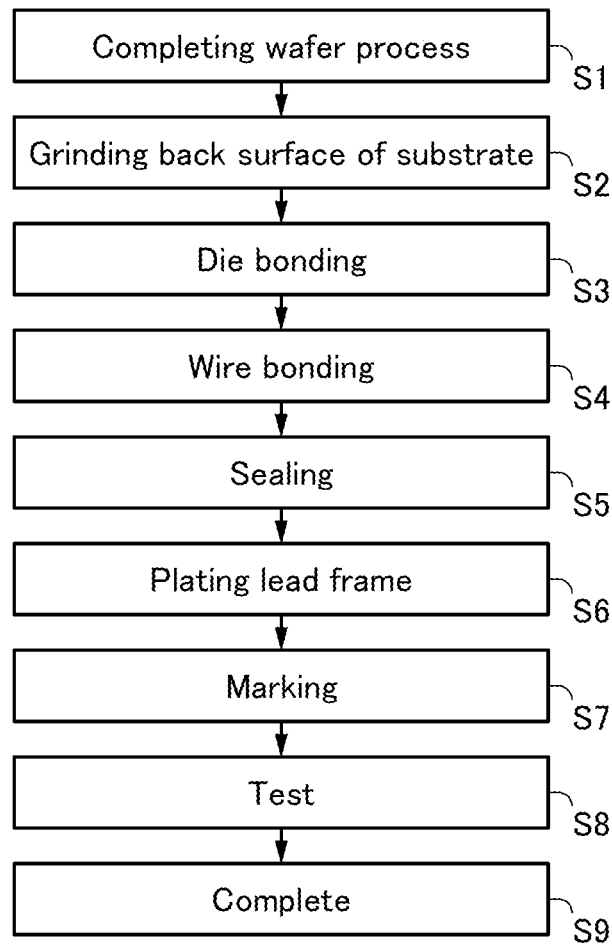
FIGS. 25A and 25B are a flow chart and a perspective view that show one embodiment of the present invention.

FIG. 25A shows an example where the semiconductor device described in the foregoing embodiment is used as an electronic component. Note that an electronic component is also referred to as semiconductor package or IC package. For the electronic component, there are various standards and names corresponding to the extraction direction of terminals or the shape of terminals; hence, one example of the electronic component will be described in this embodiment.

A semiconductor device including the transistors described in FIG. 12, FIGS. 13A to 13D, FIG. 14, and FIG. 15 in Embodiment 4 is completed through an assembly process (post-process). Furthermore, the electronic component is completed by mounting detachable components and the semiconductor device on a printed circuit board.

The post-process can be completed through steps shown in FIG. 25A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, leading to reduction of damage to the circuit portion and the wire embedded in the component that is caused by external mechanical force as well as reduction of deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The above-described electronic component can include the semiconductor device described in the above embodiment. This allows the electronic component to be less likely to malfunction and to have lower power consumption.

Figure 25B:
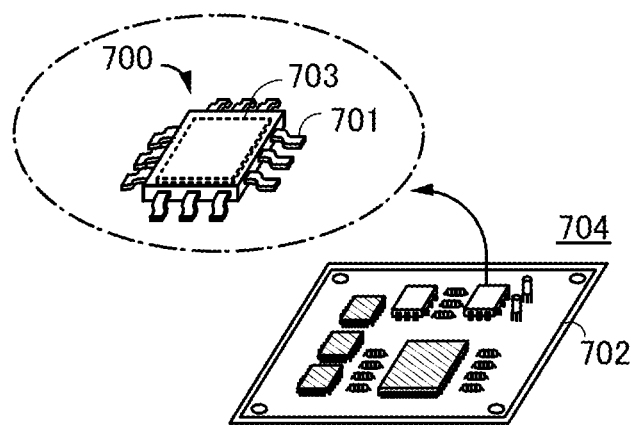

FIG. 25B is a schematic perspective diagram of a completed electronic component. FIG. 25B shows a schematic perspective diagram of a quad flat package (QFP) as an example of the electronic component. An electronic component 700 illustrated in FIG. 25B includes a lead 701 and a circuit portion 703. The electronic component 700 in FIG. 25B is, for example, mounted on a printed circuit board 702. A plurality of electronic components 700 are used in combination and electrically connected to each other over the printed circuit board 702; thus, the completed circuit board 704 can be provided in an electronic device or the like.

Next, descriptions will be given of applications of the above electronic component to electronic devices such as a computer, a portable information terminal (e.g., a mobile phone, a portable game machine, an audio reproducing device, and the like), electronic paper, a television device (also referred to as a television or a television receiver), and a digital video camera.

Figure 26A:
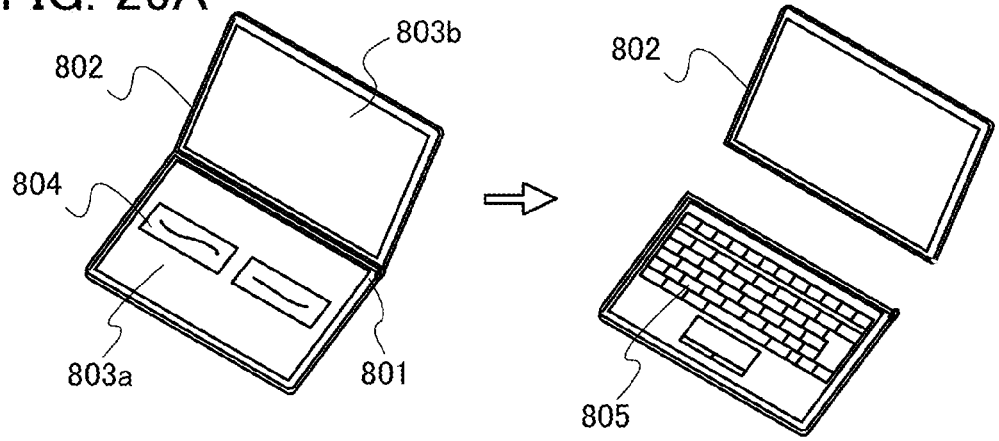
FIGS. 26A to 26E each illustrate an electronic device to which one embodiment of the present invention can be applied.

FIG. 26A illustrates a portable information terminal that includes a housing 801, a housing 802, a first display portion 803*a*, a second display portion 803*b*, and the like. The semiconductor device described in the above embodiment is provided inside at least part of the housings 801 and 802.

This allows the portable information terminal to be less likely to malfunction and to have lower power consumption.

Note that the first display portion 803*a* is a touch panel, and for example, as illustrated in the left of FIG. 26A, which of "touch input" and "keyboard input" is performed can be selected by a selection button 804 displayed on the first display portion 803*a*. Since the selection buttons with a variety of sizes can be displayed, the portable information terminal can be easily used by people of any generation. For example, when "keyboard input" is selected, a keyboard 805 is displayed on the first display portion 803*a* as illustrated in the right of FIG. 26A. With such a structure, text can be input quickly by keyboard input as in the case of using a conventional information terminal, for example.

One of the first display portion 803*a* and the second display portion 803*b* can be detached from the portable information terminal as illustrated in the right of FIG. 26A. Providing the second display portion 803*b* with a touch input function makes the information terminal convenient to carry because the weight can be further reduced and to operate with one hand while the other hand supports the housing 802.

The portable information terminal illustrated in FIG. 26A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 26A may transmit and receive data wirelessly. Through wireless communication, desired book data or the like can be purchased and downloaded from an e-book server.

Further, the housing 802 illustrated in FIG. 26A may be equipped with an antenna, a microphone function, or a wireless communication function to be used as a mobile phone.

Figure 26B:
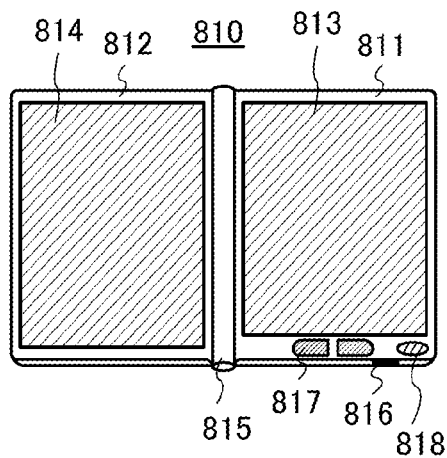

FIG. 26B illustrates an e-book reader 810 in which electronic paper is incorporated. The e-book reader includes two housings of a housing 811 and a housing 812. The housing 811 and the housing 812 are provided with a display portion 813 and a display portion 814, respectively. The housings 811 and 812 are connected by a hinge portion 815 and can be opened or closed with the hinge portion 815 as an axis. The housing 811 is provided with a power switch 816, an operation key 817, a speaker 818, and the like. At least one of the housing 811 and the housing 812 is provided with a semiconductor device including the PLD described in the above embodiment. This allows the electronic paper to be less likely to malfunction and to have lower power consumption.

Figure 26C:
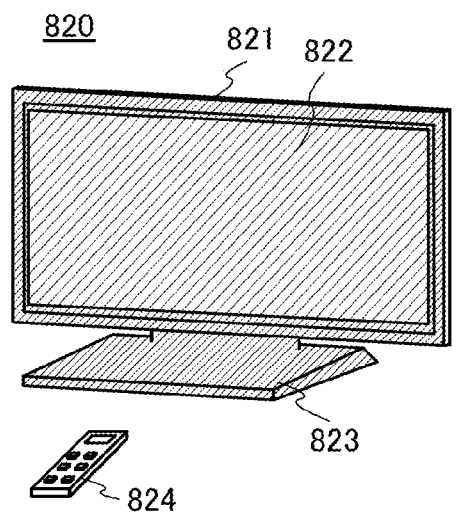

FIG. 26C illustrates a television device including a housing 821, a display portion 822, a stand 823, and the like. The television device 820 can operate with a switch of the housing 821 and a remote controller 824. A semiconductor device including the PLD described in the above embodiment is provided in the housing 821 and the remote controller 824. This allows the television device to be less likely to malfunction and to have lower power consumption.

Figure 26D:
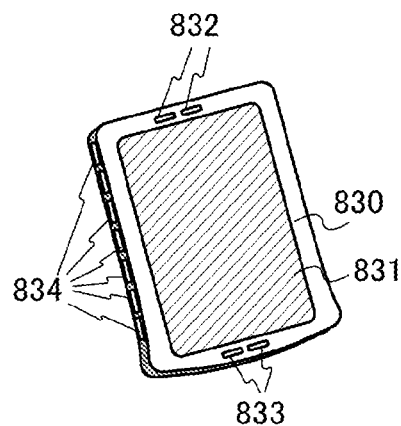

FIG. 26D illustrates a smartphone in which a main body 830 is provided with a display portion 831, a speaker 832, a microphone 833, operation keys 834, and the like. A semiconductor device including the PLD described in the above embodiment is provided in the main body 830. This allows the smartphone to be less likely to malfunction and to have lower power consumption.

Figure 26E:
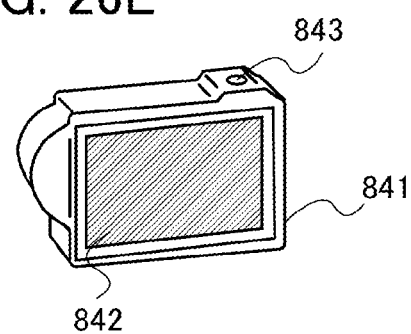

FIG. 26E illustrates a digital camera including a main body 841, a display portion 842, an operation switch 843, and the like. A semiconductor device including the PLD described in the above embodiment is provided in the main body 841. This allows the digital camera to be less likely to malfunction and to have lower power consumption.

As described above, any of the semiconductor devices of the above embodiments is provided in the electronic devices described in this embodiment. This allows the electronic devices to be less likely to malfunction and to have lower power consumption.

(Notes on Description in this Specification and the Like)

The following are notes on the description of the above embodiments and the structures in the above embodiments.

Notes on One Embodiment of the Present Invention Described in Embodiments

One embodiment of the present invention can be constituted by appropriately combining the structure described in an embodiment with any of the structures described in the other embodiments. In addition, in the case where a plurality of structure examples are described in one embodiment, any of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with a text in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

This embodiment describes one embodiment of the present invention. Other embodiments of the present invention are described in the other embodiments. Note that one embodiment of the present invention is not limited to this. That is, various embodiments of the invention are described in this embodiment and the other embodiments, and one embodiment of the present invention is not limited to a particular embodiment. For example, an example in which a channel formation region, source and drain regions, and the like of a transistor such as the transistor OM include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, for example, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example. Depending on the circumstances or conditions, the transistor such as the transistor OM, the channel formation region of the transistor, the source and drain regions of the transistor, and the like do not necessarily include an oxide semiconductor. The example in which one embodiment of the present invention is applied to a memory cell is described; however, one embodiment of the present invention is not limited thereto. For example, one embodiment of the present invention may be applied to a circuit with another function depending on circumstances or conditions. Furthermore, depending on circumstances or conditions, one embodiment of the present invention is not necessarily applied to a memory cell.

<Notes on Description for Drawings>

In this specification and the like, terms for describing arrangement, such as "over" and "under", are used for convenience to indicate a positional relation between components with reference to drawings. The positional relation between components is changed as appropriate in accordance with the direction in which each component is described. Therefore, terms for describing arrangement are not limited to the terms used in the description in the specification, and can be appropriately reworded depending on situations.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can include the case where another component is provided between the insulating layer A and the electrode B.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, the segmentation of a block in the block diagrams is not limited by any of the components described in the specification, and can be differently determined as appropriate depending on situations.

In the drawings, the size, the layer thickness, or the region has arbitrary magnitude for convenience for the description. Therefore, the scale is not necessarily limited to that illustrated in the drawings. Note that the drawings are schematically illustrated for clarity, and shapes or values are not limited to those illustrated in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

<Notes on Expressions that can be Rephrased>

In this specification and the like, in description of connections of a transistor, description of "one of a source and a drain" (or a first electrode or a first terminal), and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" or "wirings" formed in an integrated manner.

In this specification and the like, the terms "voltage" and "potential" are interchangeable in appropriate cases. The term "voltage" refers to a potential difference between a given potential and a reference potential. When the reference potential is a ground potential, the term "voltage" can be replaced with the term "potential". The ground potential does not necessarily mean 0 V. Note that a potential is relative, and a potential supplied to wirings or the like may be changed depending on a reference potential.

In this specification and the like, the terms "film", "layer", and the like can be interchanged with each other depending on the case or circumstances. For example, the term "conductive layer" can be changed into the term "conductive film" in some cases. Also, the term "insulating film" can be changed into the term "insulating layer" in some cases.

<Notes on Definitions of Terms>

The following are definitions of the terms not described in the above embodiments.

<<Switch>>

In this specification and the like, a switch is an element that is brought into a conduction state or a non-conduction state (is turned on or off) to determine whether to have a current flow therethrough or not. Alternatively, the switch is an element having a function of selecting and changing a current path.

For example, an electrical switch, a mechanical switch, or the like can be used as a switch. That is, any element can be used as a switch as long as it can control a current, without limitation to a certain element.

A transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), or a logic circuit in which such elements are combined can be used as an electrical switch.

When a transistor is used as a switch, an "on state" of the transistor refers to a state in which a source and a drain of the transistor are electrically short-circuited. Furthermore, an "off state" of the transistor refers to a state in which the source and drain of the transistor are electrically disconnected. Note that if the transistor operates just as a switch, there is no particular limitation on the polarity (conductivity type) of the transistor.

An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a top view of the transistor.

In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate overlap with each other, or a region where a channel is formed.

In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to a part of Z1 and another part of Z1 is directly connected to X while a drain (or a second terminal or the like) of the transistor is directly connected to a part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Other examples of the expressions also include "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path", and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are only examples and one embodiment of the present invention is not limited to the expressions. Here, X, Y, Z1, and Z2 each denote an object (e.g., a device, an element, a circuit, a wiring, an electrode, a terminal, a conductive film, and a layer).

This application is based on Japanese Patent Application serial no. 2014-254394 filed with Japan Patent Office on Dec. 16, 2014, the entire contents of which are hereby incorporated by reference.

What is claimed is:

1. A semiconductor device comprising:
a first buffer circuit;
a level shifter circuit electrically connected to the first buffer circuit;
a second buffer circuit electrically connected to the level shifter circuit; and
a first wiring, a second wiring, and a third wiring,
wherein each of the level shifter circuit and the second buffer circuit is electrically connected to the second wiring and the third wiring,
wherein potential that is supplied to the first wiring is switched from a third potential to a first potential,
wherein potential that is supplied to the second wiring is switched from the third potential to a second potential,
wherein switching the third potential that is supplied to the second wiring from the third potential to the second potential at a first timing follows switching the third potential that is supplied to the first wiring from the third potential to the first potential at a second timing,
wherein the second potential is higher than the first potential, and
wherein the third potential is lower than the first potential and the second potential.

2. A semiconductor device according to claim 1, further comprising:
a memory cell,
wherein the memory cell includes a first transistor,
wherein the memory cell is configured to store charge depending on data in a node connected to the first transistor that is off, and
wherein the second buffer circuit is electrically connected to a gate of the first transistor.

3. The semiconductor device according to claim 2, wherein the first transistor includes an oxide semiconductor in a channel formation region.

4. A semiconductor device according to claim 2,
wherein the level shifter circuit includes a second transistor, and
wherein the second transistor includes silicon.

5. A semiconductor device according to claim 1, wherein the third potential is a ground potential.

6. An electronic device comprising:
the semiconductor device according to claim 1; and
a display portion operationally connected to the semiconductor device.

7. A semiconductor device comprising:
a first buffer circuit;
a level shifter circuit electrically connected to the first buffer circuit; and
a first wiring, a second wiring, and a third wiring,
wherein the first buffer circuit is electrically connected to the first wiring and the third wiring,
wherein the level shifter circuit is electrically connected to the second wiring and the third wiring,
wherein a third potential of the first wiring is switched from the third potential to a first potential at a first timing,
wherein the third potential of the second wiring is switched from the third potential to a second potential at a second timing,
wherein the second timing follows the first timing,
wherein the second potential is higher than the first potential, and
wherein the third potential is lower than the first potential and the second potential.

8. A semiconductor device according to claim 7, further comprising:
a memory cell,
wherein the memory cell includes a first transistor,
wherein the memory cell is configured to store charge depending on data in a node connected to the first transistor that is off, and
wherein the level shifter circuit is electrically connected to a gate of the first transistor.

9. The semiconductor device according to claim 8, wherein the first transistor includes an oxide semiconductor in a channel formation region.

10. A semiconductor device according to claim 8,
wherein the level shifter circuit includes a second transistor, and
wherein the second transistor includes silicon.

11. A semiconductor device according to claim 7, wherein the third potential is a ground potential.

12. An electronic device comprising:
the semiconductor device according to claim 7, and
a display portion operationally connected to the semiconductor device.

* * * * *